(12) United States Patent
Jang

(10) Patent No.: US 12,021,055 B2
(45) Date of Patent: Jun. 25, 2024

(54) SEMICONDUCTOR PACKAGE AND METHOD FOR MANUFACTURING SEMICONDUCTOR PACKAGE

(71) Applicant: SAMSUNG ELECTRONICS CO., LTD., Suwon-si (KR)

(72) Inventor: Chulyong Jang, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 316 days.

(21) Appl. No.: 17/651,355

(22) Filed: Feb. 16, 2022

(65) Prior Publication Data

US 2022/0384378 A1 Dec. 1, 2022

(30) Foreign Application Priority Data

Jun. 1, 2021 (KR) .................. 10-2021-0070607

(51) Int. Cl.
*H01L 23/48* (2006.01)
*H01L 23/00* (2006.01)
(Continued)

(52) U.S. Cl.
CPC ............ *H01L 24/29* (2013.01); *H01L 23/481* (2013.01); *H01L 24/16* (2013.01); *H01L 24/32* (2013.01); *H01L 24/73* (2013.01); *H01L 24/83* (2013.01); *H01L 24/92* (2013.01); *H01L 25/0657* (2013.01); *H01L 25/105* (2013.01); *H01L 23/49816* (2013.01); *H01L 23/49822* (2013.01); *H01L 23/49833* (2013.01); *H01L 23/5385* (2013.01); *H01L 23/5386* (2013.01); *H01L 2224/16148* (2013.01); *H01L 2224/16227* (2013.01); *H01L 2224/16238* (2013.01); *H01L 2224/29005* (2013.01); *H01L 2224/29011* (2013.01); *H01L 2224/29019* (2013.01); *H01L 2224/32145* (2013.01); *H01L 2224/32225* (2013.01); *H01L 2224/73204* (2013.01); *H01L 2224/83203* (2013.01);
(Continued)

(58) Field of Classification Search
CPC .... H01L 24/29; H01L 25/0657; H01L 23/481
See application file for complete search history.

(56) References Cited

U.S. PATENT DOCUMENTS

| 8,604,615 | B2 | 12/2013 | Lee et al. |
| 9,721,930 | B2 | 8/2017 | Lee et al. |
| 9,953,958 | B2 | 4/2018 | Miki |
| 10,163,825 | B1 | 12/2018 | Liao et al. |

(Continued)

FOREIGN PATENT DOCUMENTS

KR 1020080065871 A 7/2008

*Primary Examiner* — Dale E Page
*Assistant Examiner* — Wilner Jean Baptiste
(74) *Attorney, Agent, or Firm* — Myers Bigel, P.A.

(57) ABSTRACT

A semiconductor package is provided in which a first adhesive film includes a first extension portion extending relative to a side surface of a first semiconductor chip in a second direction, perpendicular to the first direction, the first extension portion has an upper surface including a first recess concave toward a base chip, each of the plurality of second adhesive films includes a second extension portion extending relative to side surfaces of the plurality of second semiconductor chips in the second direction, and the second extension portion has an upper surface including a second recess concave in the first direction and a lower surface including a protrusion in the first recess or the second recess.

20 Claims, 17 Drawing Sheets

(51) Int. Cl.
*H01L 25/065* (2023.01)
*H01L 25/10* (2006.01)
*H01L 23/498* (2006.01)
*H01L 23/538* (2006.01)

(52) U.S. Cl.
CPC ............... *H01L 2224/92125* (2013.01); *H01L 2225/06513* (2013.01); *H01L 2225/06517* (2013.01); *H01L 2225/0652* (2013.01); *H01L 2225/06524* (2013.01); *H01L 2225/06527* (2013.01); *H01L 2225/06541* (2013.01); *H01L 2225/06548* (2013.01); *H01L 2924/1431* (2013.01); *H01L 2924/1432* (2013.01); *H01L 2924/1433* (2013.01); *H01L 2924/14335* (2013.01); *H01L 2924/1434* (2013.01); *H01L 2924/35121* (2013.01)

(56) References Cited

U.S. PATENT DOCUMENTS

| | | |
|---|---|---|
| 10,651,154 B2 | 5/2020 | Park et al. |
| 10,923,438 B2 | 2/2021 | Tsai et al. |
| 11,367,709 B2 * | 6/2022 | Fettke .................... H01L 24/13 |
| 2003/0219793 A1 | 11/2003 | Carulli et al. |
| 2010/0155966 A1 * | 6/2010 | Moden .................... H01L 24/75 |
| | | 257/783 |
| 2016/0093597 A1 | 3/2016 | Chang et al. |
| 2019/0206833 A1 | 7/2019 | Meyer et al. |
| 2019/0221520 A1 | 7/2019 | Kim et al. |
| 2020/0098719 A1 | 3/2020 | Park et al. |
| 2020/0335408 A1 | 10/2020 | Gao et al. |
| 2020/0357766 A1 | 11/2020 | Su |
| 2020/0402888 A1 | 12/2020 | Tsutsui et al. |
| 2021/0005526 A1 | 1/2021 | Yoo et al. |

* cited by examiner

I-I'

SEMICONDUCTOR PACKAGE AND METHOD FOR MANUFACTURING SEMICONDUCTOR PACKAGE

CROSS-REFERENCE TO RELATED APPLICATION(S)

This application claims benefit of priority to Korean Patent Application No. 10-2021-0070607 filed on Jun. 1, 2021 in the Korean Intellectual Property Office, the disclosure of which is incorporated herein by reference in its entirety.

BACKGROUND

The present inventive concept relates to a semiconductor package and a method for manufacturing a semiconductor package.

In line with weight reductions and the implementation of high performance in electronic devices, miniaturization and high performance may be required in the semiconductor package field as well. In order to realize miniaturization, weight reductions, high performance, high capacity, and high reliability of semiconductor packages, research and development of a semiconductor package having a structure in which semiconductor chips are stacked in multiple stages has been continuously conducted.

SUMMARY

An aspect of the present inventive concept is to provide a semiconductor package having improved reliability.

According to an aspect of the present inventive concept, a semiconductor package includes: a base chip; a first semiconductor chip, a plurality of second semiconductor chips, and a third semiconductor chip sequentially stacked on the base chip in a first direction and electrically connected to each other by a through silicon via (TSV); a first adhesive film between the base chip and the first semiconductor chip; a plurality of second adhesive films, a respective one of the plurality of second adhesive films between the first semiconductor chip and a lowermost second semiconductor chip, and between the plurality of second semiconductor chips; a third adhesive film between an uppermost one of the second semiconductor chips and the third semiconductor chip; and an encapsulant encapsulating at least a portion of each of the first semiconductor chip, the plurality of second semiconductor chips, and the third semiconductor chip on the base chip, wherein the first adhesive film includes a first extension portion extending outwardly relative to a side surface of the first semiconductor chip in a second direction that is perpendicular to the first direction, wherein the first extension portion has an upper surface including a first recess that is concave in a direction toward the base chip, wherein each of the plurality of second adhesive films includes a second extension portion extending outwardly relative to side surfaces of the plurality of second semiconductor chips in the second direction, wherein each second extending portion includes an upper surface including a second recess that is concave in a direction toward the base chip, and a lower surface including a protrusion that is in the first recess or the second recess.

According to an aspect of the present inventive concept, a semiconductor package includes: a base chip; a first semiconductor chip and a second semiconductor chip sequentially stacked on the base chip in a first direction and electrically connected to each other by a through silicon via (TSV); a first adhesive film between the base chip and the first semiconductor chip and including a first extension portion extending outwardly relative to a side surface of the first semiconductor chip in a second direction that is perpendicular to the first direction; and a second adhesive film between the first semiconductor chip and the second semiconductor chip and including a second extension portion extending outwardly relative to a side surface of the second semiconductor chip in the second direction, wherein an upper surface of the first extension portion is coplanar with an upper surface of the first semiconductor chip and includes a first recess that is concave in a direction toward the base chip, and wherein a lower surface of the second extension portion includes a protrusion in contact with the upper surface of the first extension portion and in the first recess.

In another aspect, a semiconductor package includes: a base chip; a chip stack including a first semiconductor chip on the base chip, a second semiconductor chip on the first semiconductor chip, and a third semiconductor chip on the second semiconductor chip; a first adhesive film between the base chip and the first semiconductor chip, wherein the first adhesive film includes a first recess spaced apart from a side surface of the first semiconductor chip in a second direction that is perpendicular to a first direction; a second adhesive film between the first semiconductor chip and the second semiconductor chip, wherein the second adhesive film includes a second recess spaced apart from a side surface of the second semiconductor chip in the second direction, and a first protrusion in the first recess; and a third adhesive film between the second semiconductor chip and the third semiconductor chip, wherein the third adhesive film includes a second protrusion in the second recess, wherein at least a portion of the second recess overlaps the first recess in the first direction.

In another aspect, a method for manufacturing a semiconductor package including: preparing a base chip; preparing a first semiconductor chip having a lower surface with a bump structure; covering the bump structure on the lower surface of the first semiconductor chip with a first adhesive film; adsorbing an upper surface of the first semiconductor chip to a bonding device, wherein the bonding device includes a dam structure surrounding a side surface of the first semiconductor chip; fixing the first semiconductor chip to the base chip, and forming, by a thermal compression process, a first extension portion that extends outwardly, relative to the side surface of the first semiconductor chip, and that includes a first recess corresponding to the dam structure at one end of the first adhesive film.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1A:
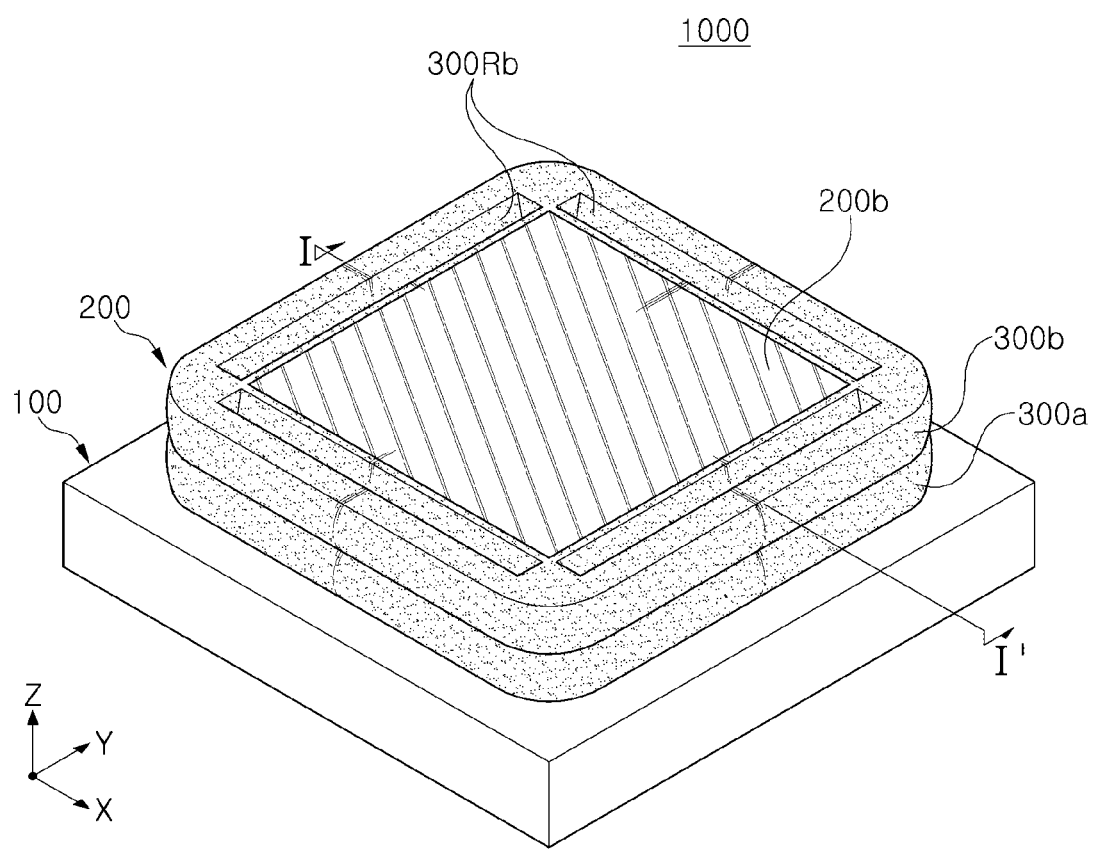
FIG. 1A is a perspective view illustrating a semiconductor package according to an embodiment of the present inventive concept.
Figure 1B:
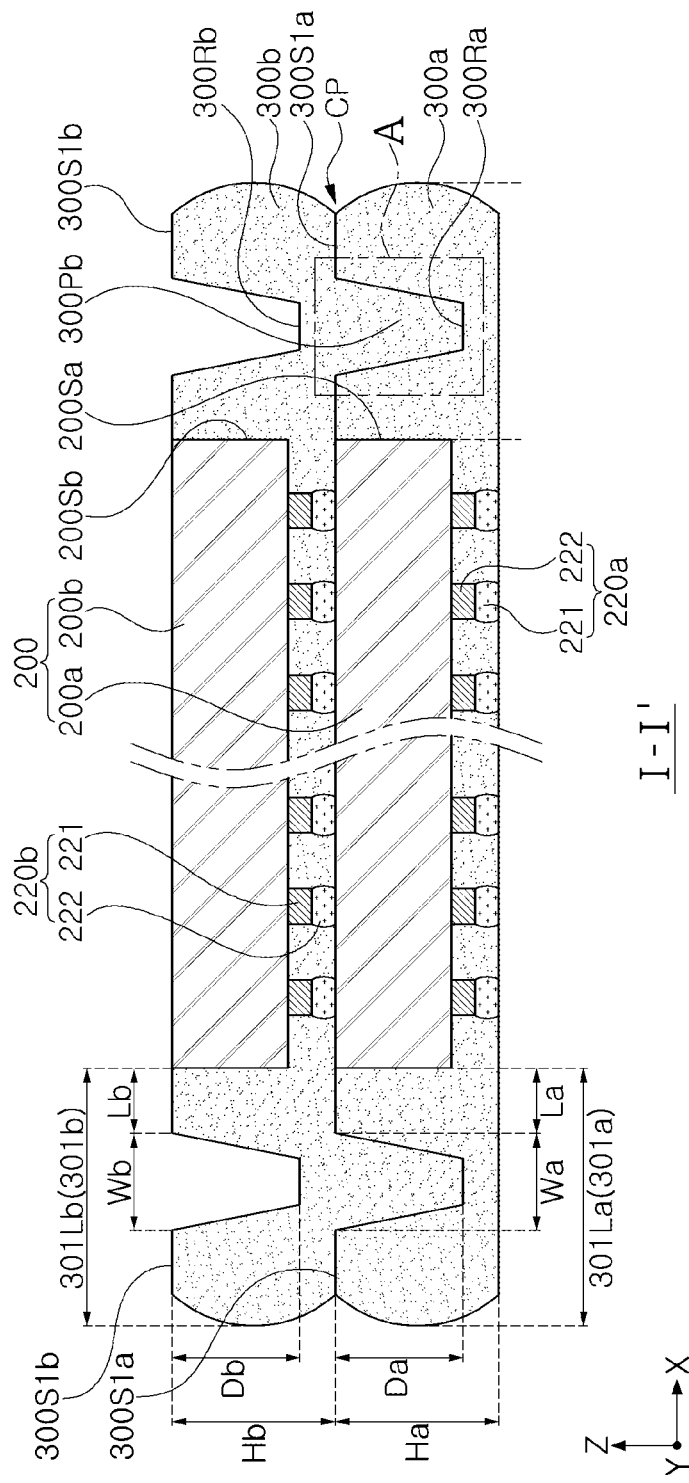
FIG. 1B is a cross-sectional view taken along line I-I' of FIG. 1A.

FIG. 1A is a perspective view illustrating a semiconductor package 1000 according to an embodiment of the present inventive concept, and FIG. 1B is a cross-sectional view illustrating a cross-section taken along line I-I' of FIG. 1A. FIG. 1B omits a base chip 100 of FIG. 1A and shows only a chip stack 200 and adhesive films 300a and 300b.

Referring to FIGS. 1A and 1B, a semiconductor package 1000 according to an embodiment may include a base chip 100, a chip stack 200, and a plurality of adhesive films 300a and 300b. In the present inventive concept, a concave-convex structure is formed between the plurality of adhesive films 300a and 300b, thereby blocking propagation of cracks in an interface between the plurality of adhesive films and preventing delamination of the plurality of adhesive films 300a and 300b.

The base chip 100, a support substrate on which the chip stack 200 and the plurality of adhesive films 300a and 300b are mounted, may include a semiconductor material such as a silicon (Si) wafer, or according to an embodiment, the base chip 100 may be a printed circuit board (PCB) or a glass substrate that does not contain a semiconductor material. A pad ('105' in FIG. 4) electrically connected to the chip structure 200 may be disposed on an upper surface of the base chip 100, and a bump structure ('120' in FIG. 4) may be disposed on a lower surface of the base chip 100. The shape of the base chip 100 may be variously modified according to embodiments. In an example, the base chip 100 may have an area larger than a planar area (area in the X-Y plane) of the chip stack 200 and the plurality of adhesive films 300a and 300b. For example, the chip stack 200 may be stacked on the base chip 100 in a first direction (Z-axis direction), and the base chip 100 may have a width greater than a width of each of the chip stack 200 and the plurality of adhesive films 300a and 300b in a second direction (X-axis and Y-axis directions). However, embodiments of the present inventive concept are not limited thereto. For example, the area of the base chip 100 may be smaller than or equal to the area of the chip stack 200 and/or the plurality of adhesive films 300a and 300b.

The chip stack 200 may include a plurality of semiconductor chips 200a and 200b. The plurality of semiconductor chips 200a and 200b may include a first semiconductor chip 200a and a second semiconductor chip 200b sequentially stacked on the upper surface of the base chip 100 in the first direction (Z-axis direction). The first and second semiconductor chips 200a and 200b may be electrically connected to each other by a through silicon via (TSV) ('230a' in FIG. 4). An electrical connection structure of the chip stack 200 including the TSV will be described later with reference to FIG. 4 and the like. In an example, the plurality of semiconductor chips 200a and 200b may be the same type of semiconductor chips. For example, both the first and second semiconductor chips 200a and 200b may be memory chips. According to an example embodiment, a third semiconductor chip ('200c' in FIG. 4) may be further disposed on the second semiconductor chip 200b. Here, the third semiconductor chip ('200c' in FIG. 4) is the uppermost semiconductor chip in the chip stack 200, which will be described later with reference to FIG. 4 and the like. Bump structures 220a and 220b may be disposed below the plurality of semiconductor chips 200a and 200b, respectively. The bump structures 220a and 220b may be microbumps having a fine pitch. In an example, the bump structures 220a and 220b may each include a pillar portion 221 on a lower pad (not illustrated) of each of the plurality of semiconductor chips 220a and 220b and a solder portion 222 below the pillar portion 221. Also, the second semiconductor chip 200b may be provided as a plurality of second semiconductor chips (e.g., '200b1' and '200b2' of FIG. 4) stacked in the first direction (Z-axis direction). According to the present inventive concept, by introducing the concave-convex structure at the interface of the plurality of adhesive films 300a and 300b interposed between the plurality of semiconductor chips 200a and 200b, propagation of cracks in the interface of the adhesive films 300a and 300b may be blocked and delamination of the adhesive films 300a and 300b may be prevented, thereby improving reliability of the semiconductor package 1000.

Figure 4:
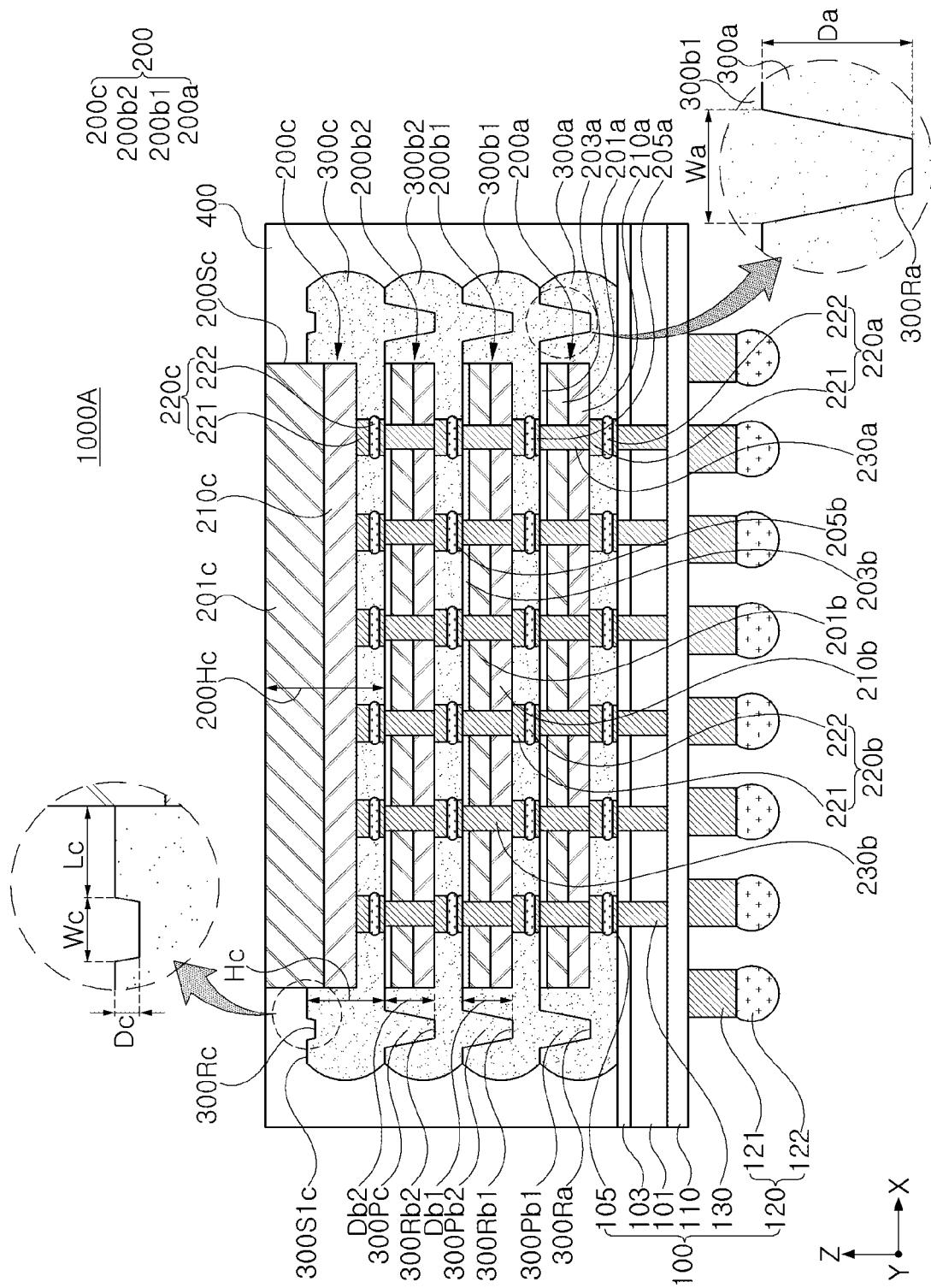
FIG. 4 is a cross-sectional view illustrating a semiconductor package according to an embodiment of the present inventive concept.

The plurality of adhesive films 300a and 300b may be non-conductive material layers electrically insulating the adjacent bump structures 220a and 220b. The non-conductive material may include an epoxy-based material not containing conductive particles. For example, the plurality of adhesive films 300a and 300b may be non-conductive films (NCFs). The plurality of adhesive films 300a and 300b may be disposed below the plurality of semiconductor chips 200a and 200b of the chip stack 200 and include extension portions 301a and 301b extending outwardly, relative to the side surfaces 200Sa and 200Sb of the corresponding semiconductor chips 200a and 200b. For example, the plurality of adhesive films 300a and 300b may include a first adhesive film 300a and a second adhesive film 300b sequentially stacked on the base chip 100. The first adhesive film 300a may be disposed between the base chip 100 and the first semiconductor chip 200a and include a first extension portion 301a extending, relative to the side surface 200Sa of the first semiconductor chip in the second direction (the X-axis and Y-axis direction), as illustrated in FIG. 1B. The second adhesive film 300b may be disposed between the first semiconductor chip 200a and the second semiconductor chip 200b and includes a second extension portion 301b extending, relative to the side surface 200Sb of the second semiconductor chip 200b in the second direction (X-axis and Y-axis direction), as illustrated in FIG. 1B. As illustrated in FIG. 4, the second adhesive film 300b may be provided as a plurality of second adhesive films ('300b1' and '300b2' of FIG. 4) to correspond to the plurality of second semiconductor chips ('200b1' and '200b2' of FIG. 4). The plurality of second adhesive films ('300b1' and '300b2' of FIG. 4) may be understood as including characteristics the same as or similar to those of the second adhesive film 300b to be described later. In the drawing, the plurality of adhesive films 300a and 300b are illustrated to have the same horizontal width, but the horizontal widths (maximal extension portion length in the X-axis or Y-axis direction) of the plurality of adhesive films 300a and 300b may be different from each other according to embodiments.

The plurality of adhesive films 300a and 300b fix the plurality of semiconductor chips 200a and 200b adjacent to each other to maintain the stack structure of the chip stack 200 and contribute to securing electrical and physical reliability of the package. However, depending on a process, when an interface is formed between the plurality of adhesive films 300a and 300b, cracks CP (FIG. 1B) may occur outside a boundary between the plurality of adhesive films 300a and 300b or may propagate along the boundary, and as a result, the adhesive films 300a and 300b protecting the bump structures 220a and 220b may be delaminated and the bump structures 220a and 220b may be damaged. Therefore, the present inventive concept adopts a concave-convex structure increasing a contact area of the adhesive films 300a and 300b and blocking propagation of cracks in the portion (i.e., the extension portion) in which the plurality of adhesive films 300a and 300b protrude outwardly from the chip stack 200, thereby preventing delamination of the adhesive films 300a and 300b and damage to the bump structures 220a and 220b and improving reliability of the semiconductor package 1000.

For example, the concave-convex structure may include a first recess 300Ra of an upper surface of the first adhesive film 300a and a protrusion 300Pb of a lower surface of the second adhesive film 300b to fill the first recess 300Ra. In an example, the first recess 300Ra and the protrusion 300Pb may be formed using a bonding device ('20' of FIG. 8A) with a dam structure in a thermal compression (TC) bonding process of the chip structure 200 and the plurality of adhesive films 300a and 300b. In an embodiment, an upper surface 300S1a of the first extension portion 301a of the first adhesive film 300a may be on substantially the same level as that of an upper surface of the first semiconductor chip 200a and include a first recess 300Ra concave in a direction toward the base chip 100, as illustrated in FIG. 1B, and a lower surface of the second extension portion 301b of the second adhesive film 300b may be in contact with the upper surface 300S 1a of the first extension portion 301a and include a protrusion 300Pb in the first recess 300Ra, as illustrated in FIG. 1B. Accordingly, the concave-convex structure including the first recess 300Ra concave in a direction facing the base chip 100 and the protrusion 300Pb convex in a direction facing the base chip 100 may be formed on the interface between the first adhesive film 300a and the second adhesive film 300b. Here, the upper surface 300S1a of the first extension portion 301a and the upper surface 300S1b of the second extension portion 301b are coplanar with the upper surfaces of the first and second semiconductor chips 200a and 200b, respectively. Also, the first recess 300Ra and the second recess 300Rb may be disposed to continuously or discontinuously surround a side surface of the chip stack 200. Although the second recess 300Rb is illustrated as a plurality of trenches adjacent to the side surface of the second semiconductor chip 200b in FIG. 1A, the planar shape of the second recess 300Rb and the first recess 300Ra may be variously modified.

In an embodiment, a minimal distance La (FIG. 1B) between the first recess 300Ra and the side surface 200Sa of the first semiconductor chip 200a may be about 10% or more or about 20% or more of a length 301L1 of the first extension portion 301a in the second direction (e.g., the X-axis direction). For example, a ratio of the minimal distance La to the length 301La of the first extension portion 301a may range from about 0.1 or more or about 0.2 or more, for example, about 0.1 to about 0.6, about 0.2 to about 0.5, or about 0.2 to about 0.4. When the minimal distance La is less than about 10% of the length 301La of the first extension portion 301a, a portion between the first recess 300Ra and the side surface 200Sa of the first semiconductor chip 200a may not be fully filled with a non-conductive material or a void may occur. Here, the length 301La of the first extension portion 301a may be interpreted as a maximum extension portion length of the first extension portion 301a in the second direction (e.g., the X-axis direction), but the length 301La may also be interpreted as a length of the upper surface 300S 1a of the first extension portion 301a according to the embodiment.

In addition, the maximal width Wa (FIG. 1B) in the second direction (e.g., X-axis direction) of the first recess 300Ra is about 30% or more or about 40% of the length 301La of the first extension portion 301a. For example, a ratio of the maximal width Wa of the first recess 300Ra to the length 301La of the first extension portion 301a may be in the range of about 0.3 to about 0.7 or about 0.4 to about 0.6. If the maximal width Wa is less than about 30% of the length 301La of the first extension portion 301a, the first recess 300Ra may not be fully filled with a non-conductive material forming the protrusion 300Pb or an effect of preventing cracks may be lowered.

In addition, a depth Da (FIG. 1B) of the first recess 300Ra in the first direction (the Z-axis direction) is about 90% or less or 80% or less of a height Ha (FIG. 1B) from the lower surface of the first extension portion 301a to the upper surface 300S1a. For example, a ratio of the depth Da of the first recess 300Ra to the height Ha of the first extension portion 301a may be in the range of about 0.3 to about 0.9 or about 0.4 to about 0.8. When the depth Da of the first recess 300Ra exceeds about 90% of the height Ha of the first extension portion 301a, cracks may occur in a lower portion of the first recess 300Ra or a portion between the edge of the extension portion 301a and the first recess 300Ra may not be completely filled with a non-conductive material.

Meanwhile, a shape of the second extension portion 301b, for example, the length 301Lb, the height Hb, (FIG. 1B) etc., may not be the same as the length 301La and the height Ha of the first extension portion 301a. Therefore, the ratio between the second recess 300Rb and the second extension portion 301b may not match the ratio between the first recess 300Ra and the first extension portion 301a. However, the second recess 300Rb may have a shape substantially the same as or similar to that of the first recess 300Ra (e.g., a maximal width Db and a depth Db) and may overlap the first recess 300Ra in a vertical direction (Z-axis direction). In an example, a minimal distance Lb (FIG. 1B) between the second recess 300Rb and the side surface 200Sb of the second semiconductor chip 200b may be substantially equal to the distance La of the first recess 300Ra. Here, "substantially the same" means that the first recess 300Ra and the second recess 300Rb are not disposed in a stagger manner by intentionally shifting the second recess 300Rb, rather than having the completely same numerical values physically. However, embodiments according to the present inventive concept are not limited thereto and the second recess 300Rb may be staggered from the first recess 300Ra according to embodiments. In addition, the shape of the first recess 300Ra except for the features described above is not particularly limited.

Hereinafter, a modified example of the recess that may be deformed to have various shapes will be described with reference to FIGS. 2A to 3B.

Figure 2A:
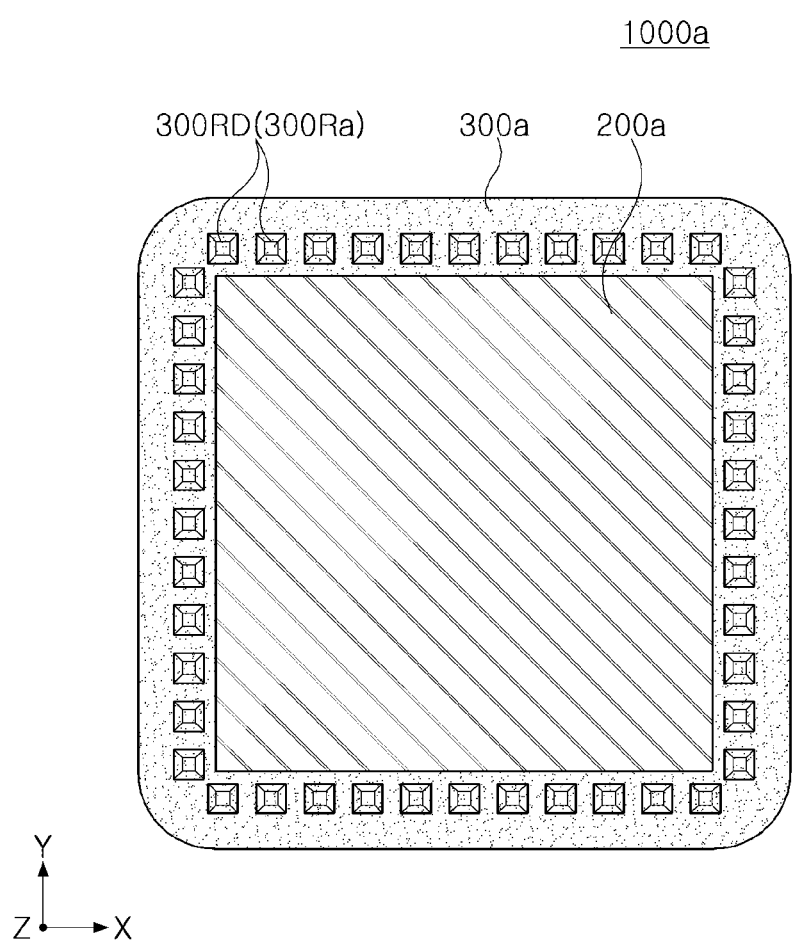
FIGS. 2A to 2C are plan views each illustrating a modified example of some components of a semiconductor package according to an embodiment of the present inventive concept.
Figure 2B:
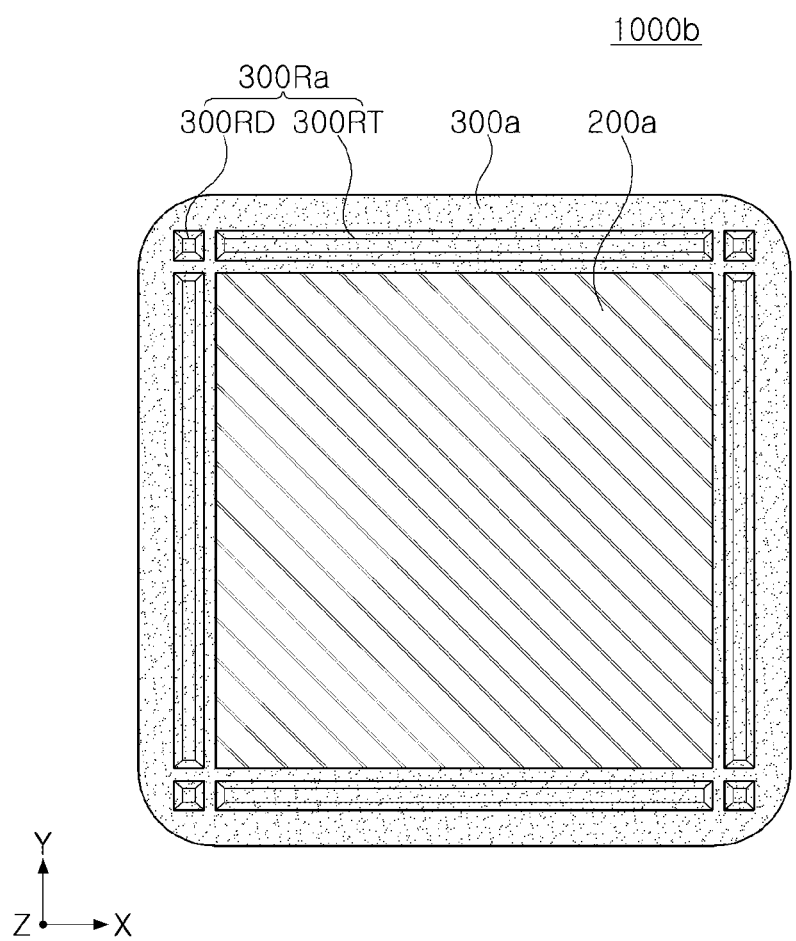
Figure 2C:
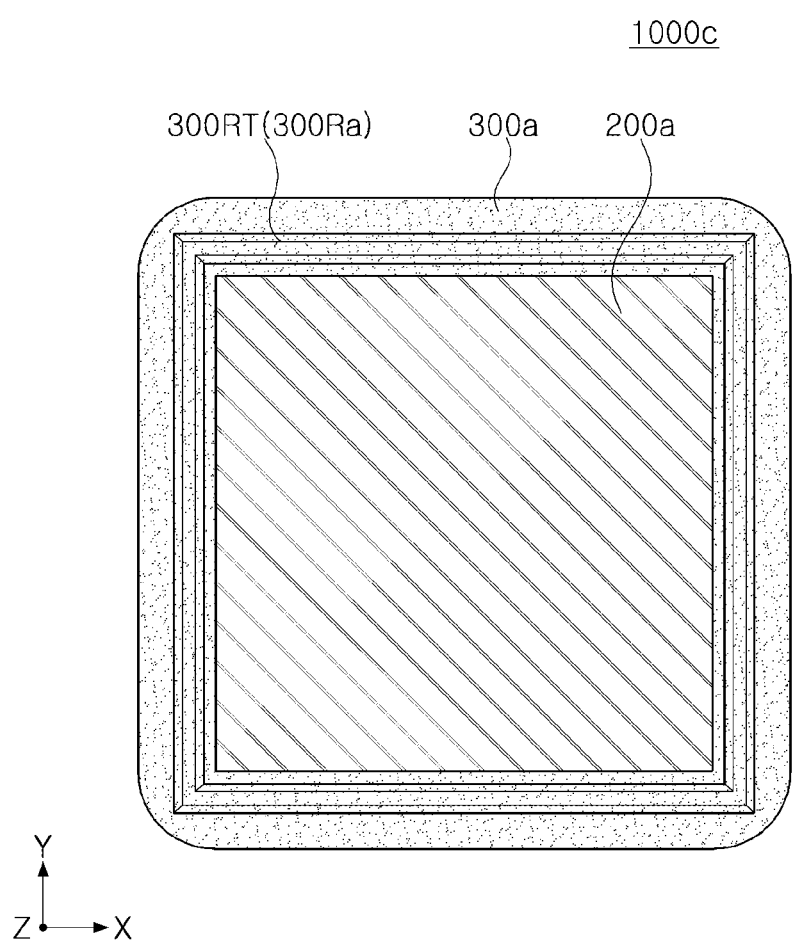

FIGS. 2A to 2C are plan views illustrating modified examples of some components of a semiconductor package according to an embodiment of the present inventive concept, respectively. FIGS. 2A to 2C illustrate upper surfaces of the first semiconductor chip 200a and the first adhesive film 300a.

Referring to FIG. 2A, in a modified example, a semiconductor package 1000a may include a first recess 300Ra including a plurality of dot structures 300RD discontinuously surrounding the side surface of the first semiconductor chip 200a. For example, in the dot structure 300RD, a width of the first recess 300Ra in a direction parallel to the side surface of the first semiconductor chip 200a may be smaller than or substantially equal to a width ('Wa' of FIG. 1B) in a direction, perpendicular to the side surface of the first semiconductor chip 200a. In the drawings, a planar shape of the dot structure 300RD is illustrated as a square, but it may be modified into various shapes such as a rectangle, a circle, and an oval. A distance between the plurality of dot structures 300RD may be determined in consideration of a filling state of a non-conductive material constituting the first adhesive film 300a.

Referring to FIG. 2B, in a modified example, a semiconductor package 1000b may include a first recess 300Ra including a plurality of dot structures 300RD and a plurality of trench structures 300RT discontinuously surrounding the side surface of the first semiconductor chip 200a. For example, in the trench structure 300RT, a width of the first recess 300Ra in a direction, parallel to the side surface of the first semiconductor chip 200a, may be greater than the width ('Wa' of FIG. 1B) in a direction, perpendicular to the side surface of the first semiconductor chip 200a. A distance between the plurality of dot structures 300RD and the plurality of trench structures 300RT may be determined in consideration of a filling state of a non-conductive material constituting the first adhesive film 300a.

Referring to FIG. 2C, in a modified example, a semiconductor package 1000c may include a first recess 300Ra including a trench structure 300RT continuously surrounding the side surface of the first semiconductor chip 200a. For example, the trench structure 300RT may extend along the side surface of the first semiconductor chip 200a and may have a shape completely surrounding the side surface of the first semiconductor chip 200a. Even in this case, the trench structure 300RT may maintain a predetermined distance ('La' in FIG. 1B) to the side surface of the first semiconductor chip 200a. In the drawing, a corner portion of the trench structure 300RT is illustrated to be bent at 90 degrees to correspond to a corner portion of the first semiconductor chip 200a, but the corner portion may be deformed to have a gently rounded shape.

Figure 3A:
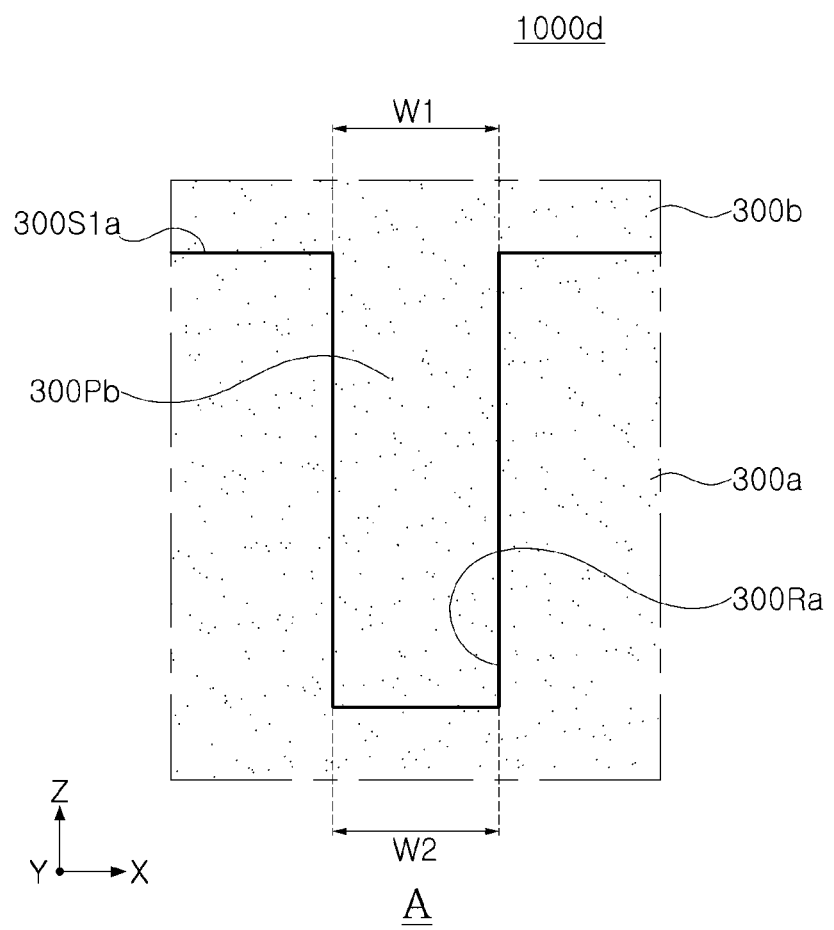
FIGS. 3A and 3B are partially enlarged views each illustrating a modified example of some components of a semiconductor package according to an embodiment of the present inventive concept.
Figure 3B:
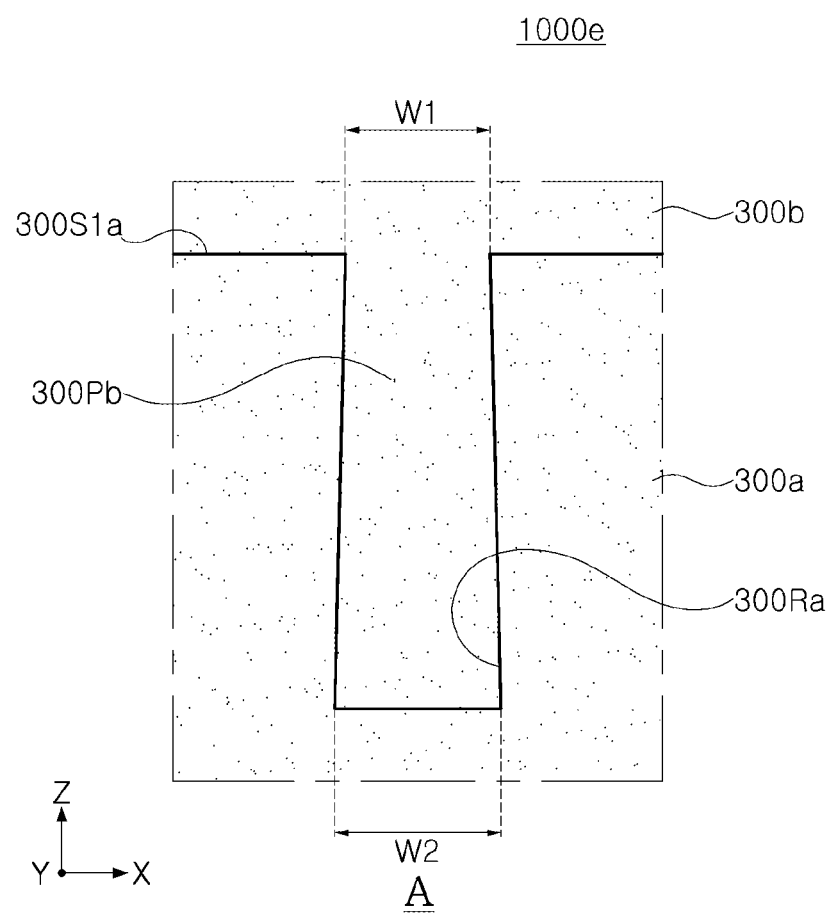

FIGS. 3A and 3B are partially enlarged views each illustrating a modified example of some components of a semiconductor package according to an embodiment of the present inventive concept. FIGS. 3A and 3B show a region corresponding to 'A' in FIG. 1B.

Referring to FIG. 3A, in a modified example, a semiconductor package 1000d may include a first recess 300Ra (and a protrusion 300Pb) in which an upper width W1 and a lower width W2 have substantially the same shape. In FIG. 1B, the first recess 300Ra has a tapered shape so that a width of an upper portion is greater than a width of a lower portion. This may be advantageous when considering an anti-crack and non-conductive material filling. However, depending on the embodiment, the shape of the first recess 300Ra may be variously modified, for example, as illustrated in FIG. 3A, the upper width W1 and the lower width W2 of the first recess 300Ra may be substantially the same.

Referring to FIG. 3B, in a modified example, a semiconductor package 1000e may include a first recess 300Ra (and a protrusion 300Pb) in which an upper width W1 is smaller than a lower width W2. A cross-sectional shape of the first recess 300Ra illustrated in FIGS. 1B, 3A, and 3B may be selected in consideration of process conditions (e.g., pressure during thermocompression bonding, the amount of a non-conductive material constituting the adhesive film, etc.) or a size (e.g., a planar shape, a depth of the recess, etc.) of the recess 300Ra.

FIG. 4 is a cross-sectional view illustrating a semiconductor package 1000A according to an embodiment of the present inventive concept.

Referring to FIG. 4, a semiconductor package 1000A according to an embodiment may include a base chip 100, a chip stack 200 including a first semiconductor chip 200a, a plurality of second semiconductor chips 200b1 and 200b2, and a third semiconductor chip 200c, and first to third adhesive films 300a, 300b1, 300b2, and 300c respectively disposed below the first to third semiconductor chips 200a, 200b1, 200b2, and 200c. In addition, the semiconductor package 1000A may further include an encapsulant 400 disposed on the base chip 100. The present embodiment has features similar to those described above with reference to FIGS. 1A and 1B, except for a shape of the third semiconductor chip 200c located on the uppermost side of the chip structure 200 and the third adhesive film 300c therebelow.

The base chip 100 may include a semiconductor material such as a silicon (Si) wafer. In the present embodiment, the base chip 100 may include a substrate 101, an upper protective layer 103, an upper pad 105, a device layer 110, a bump structure 120, and a TSV 130. The base chip 100 may be, for example, a buffer chip including a plurality of logic devices and/or memory devices in the device layer 110. Accordingly, the base chip 100 may transmit a signal from the semiconductor chip 200 stacked thereon to the outside, and may also transmit a signal and power from the outside to the semiconductor chip 200. The base chip 100 may perform both a logic function and a memory function through the logic devices and memory devices, but according to an embodiment, the base chip 100 may include only logic devices to perform only a logic function.

The substrate 101 may include, for example, a semiconductor device such as silicon or germanium (Ge) or a compound semiconductor such as silicon carbide (SiC), gallium arsenide (GaAs), indium arsenide (InAs), or indium phosphide (InP). The substrate 101 may have a silicon on insulator (SOI) structure. The substrate 101 may include a conductive region, for example, a well doped with an impurity or a structure doped with an impurity. The substrate 101 may include various device isolation structures such as a shallow trench isolation (STI) structure.

The upper protective layer 103 may be formed on an upper surface of the substrate 101 and protect the substrate 101. The upper protective layer 103 may be formed of an insulating layer such as a silicon oxide film, a silicon nitride film, or a silicon oxynitride film, but the material of the upper protective layer 103 is not limited thereto. For example, the upper protective layer 103 may be formed of a polymer such as polyimide (PI). Although not illustrated in the drawings, a lower protective layer may be further formed on a lower surface of the device layer 110.

The upper pad 105 may be disposed on the upper protective layer 103. The upper pad 105 may include, for example, at least one of aluminum (Al), copper (Cu), nickel (Ni), tungsten (W), platinum (Pt), and gold (Au). A lower pad (not illustrated) may be disposed on an upper portion of the bump structure 120 (a lower portion of the device layer 110) and may include a material similar to that of the upper pad 105. However, the material of the upper pad 105 and the lower pad (not illustrated) is not limited to the above materials.

The device layer 110 may be disposed on a lower surface of the substrate 101 and may include various types of devices. For example, the device layer 110 may include a field effect transistor (FET) such as a planar EFT or a FinFET, a memory device such as a flash memory, a dynamic random access memory (DRAM), a static random access memory (SRAM), an electrically erasable programmable read-only memory (EEPROM), a phase-change random access memory (PRAM), a magnetoresistive random access memory (MRAM), a ferroelectric random access memory (FeRAM), a resistive random access memory (RRAM), a logic device such as AND, OR, NOT, etc., and various active and/or passive devices such as a system large scale integration (LSI), a CMOS imaging sensor (CIS), or a micro-electro-mechanical system (MEMS).

The device layer 110 may include an interlayer insulating layer and a multilayer interconnection layer on the devices described above. The interlayer insulating layer may include silicon oxide or silicon nitride. The multilayer interconnection layer may include multilayer interconnections and/or vertical contacts. The multilayer interconnection layer may connect the devices of the device layer 110 to each other, connects the devices to a conductive region of the substrate 101 or connect the devices to the bump structure 120.

The bump structure 120 may be disposed on a lower surface of the base chip 100 and may be connected to an interconnection inside the device layer 110 or the TSV 130. The bump structure 120 may include a pillar portion 121 and a solder portion 122 below the pillar portion 121. However, according to an embodiment, the bump structure 120 may have a structure including only the pillar portion 121 or the solder portion 122. The semiconductor package 1000A may be mounted on an external substrate such as an interposer or a package substrate through the bump structure 120.

A TSV 130 may penetrate through the substrate 101 in a vertical direction (the Z-direction) and provide an electrical path connecting the upper pad 105 and the bump structure 120 (or the lower pad (not illustrated)). The TSV 130 may include a conductive plug and a barrier layer surrounding the conductive plug. The conductive plug may include a metal material, for example, tungsten (W), titanium (Ti), aluminum (Al), or copper (Cu). The conductive plug may be formed by a plating process, a PVD process, or a CVD process. The barrier film may include an insulating barrier film and/or a conductive barrier film. The insulating barrier film may include an oxide film, a nitride film, a carbide film, a polymer, or a combination thereof. The conductive barrier film may be disposed between the insulating barrier film and the conductive plug. The conductive barrier film may include, for example, a metal compound such as tungsten nitride (WN), titanium nitride (TiN), or tantalum nitride (TaN). The barrier film may be formed by a PVD process or a CVD process.

The chip structure 200 may have the same or similar characteristics as those described above with reference to FIGS. 1A and 1B except that the chip structure 200 includes a plurality of second semiconductor chips 200b1 and 200b2 and a third semiconductor chip 200c. In addition, the first semiconductor chip 200a and the plurality of second semiconductor chips 200b1 and 200b2 may each include TSVs 230a and 230b, and the first semiconductor chip 200a, the plurality of second semiconductor chips 200b1 and 200b2, and the third semiconductor chip 200c may be electrically connected to each other through the TSVs 230a and 230b. In FIG. 4, the structure of the first and second semiconductor chips 200a, 200b1, and 200b2 including the TSVs 230a and 230b are illustrated in more detail than in FIG. 1B.

Hereinafter, a detailed description of the first semiconductor chip 200a may be understood to be equally applicable to the plurality of second semiconductor chips 200b1 and 200b2 and the third semiconductor chip 200c. In the drawings, the chip structure is illustrated as being a total of four semiconductor chips, but the number of semiconductor chips is not limited thereto in embodiments of the present inventive concept.

The first semiconductor chip 200a may be stacked on an upper surface of the base chip 100 and may include a substrate 201a, a device layer 210a, and a bump structure 220a. The substrate 201a may have characteristics similar to those described above for the substrate 101 of the base chip 100. The device layer 210a may include a plurality of memory devices. For example, the device layer 210a may include volatile memory devices such as DRAM and SRAM, or nonvolatile memory devices such as PRAM, MRAM, FeRAM, or RRAM. For example, in the semiconductor package 1000A of the present embodiment, the first semiconductor chip 200a may include DRAM devices in the device layer 210a. Accordingly, the semiconductor package 1000A of the present embodiment may be used for a high bandwidth memory (HBM) product, an electro-data processing (EDP) product, or the like.

The device layer 210a may include a multilayer interconnection layer therebelow. The multilayer interconnection layer may have characteristics similar to those described above for the multilayer interconnection layer of the device layer 110 in the base chip 100. Accordingly, the devices of the device layer 210a may be electrically connected to the bump structure 220 through the multilayer interconnection layer. In an example, the base chip 100 may include a plurality of logic devices and/or memory devices in the device layer 110 and may be referred to as a buffer chip or a control chip according to a function thereof, whereas the first semiconductor chip 200a may include a plurality of memory devices in the device layer 210a and may be referred to as a core chip.

The bump structure 220a may be disposed on a lower surface of the device layer 210a and may be connected to microcircuit devices in the device layer 210a through interconnections of the device layer 210a. The bump structure 220a may electrically connect the first semiconductor chip 200a and the base chip 100. The bump structure 220 may include, for example, a pillar portion 221 and a solder portion 222 together. The pillar portion 221 may have a cylindrical shape or a polygonal column shape such as a square column or an octagonal column and may include, for example, nickel (Ni), copper (Cu), palladium (Pd), platinum (Pt), gold (Au), or a combination thereof. The solder portion 222 may include a spherical or ball shape, for example, tin (Sn), indium (In), bismuth (Bi), antimony (Sb), copper (Cu), silver (Ag), zinc (Zn), lead (Pb) and/or alloys thereof. The alloys may include, for example, Sn—Pb, Sn—Ag, Sn—Au, Sn—Cu, Sn—Bi, Sn—Zn, Sn—Ag—Cu, Sn—Ag—Bi, Sn—Ag—Zn, Sn—Cu—Bi, Sn—Cu—Zn, and Sn—Bi—Zn.

The TSV 230a may penetrate through the substrate 201a and the upper protective layer 203a in a vertical direction (the Z-direction) and provide an electrical path connecting the upper pad 205a and the bump structure 220a (or the lower pad (not illustrated)). The plurality of TSVs 230a and 230b included in the first and second semiconductor chips 200a, 200b1, and 200b2 may have the same characteristics as those of the TSV 130 of the base chip 100.

The plurality of second semiconductor chips 200b1 and 200b2 may each include a substrate 201b, a device layer 210b, a bump structure 220b, etc., which may be understood as having the same characteristics as those of the substrate 201a, the device layer 210a, and the bump structure 220a of the first semiconductor chip 200a described above. The third semiconductor chip 200c may include a substrate 201c, a device layer 210c, and a bump structure 220c, similarly to the first and second semiconductor chips 200a, 200b1, and 200b2, but may be different from the first and second semiconductor chips 200a, 200b1, and 200b2 in that the third semiconductor chip 200c does not include a TSV and an upper protective layer surrounding an upper portion of the TSV. In an example, a thickness of the third semiconductor chip 200c may be greater than a thickness of the first and second semiconductor chips 200a, 200b1, and 200b2. In the drawing, the plurality of second semiconductor chips 200b1 and 200b2 are illustrated as a total of two semiconductor chips, but the number of second semiconductor chips is not limited thereto in embodiments (refer to FIG. 8F) of the present inventive concept.

The encapsulant 400 may be disposed on the base chip 100 and may encapsulate the chip stack 200. The encapsulant 400 may cover side surfaces of the first to third adhesive films 300a, 300b1, 300b2, and 300c and may expose an upper surface of the third semiconductor chip 200c according to an embodiment. The encapsulant 400 may include, for example, an epoxy mold compound (EMC) but a material of the encapsulant 400 is not particularly limited.

In the present inventive concept, the concave-convex structure including the recesses 300Ra, 300Rb1, and 300Rb2 and protrusions 300Pb1, 300Pb2, and 300Pc is introduced to the extension portions (see '301a' and '301b' of FIG. 1B) of each of the plurality of adhesive films 300a, 300b1, and 300b2 protruding outwardly from the chip stack 200, thereby preventing delamination of the adhesive films 300a, 300b1, 300b2, and 300c and damage to the bump structures 220a, 220b, and 220c and improving reliability of the semiconductor package 1000A.

In the present embodiment, unlike the embodiment illustrated in FIG. 1B, a plurality of second adhesive films 300b1 and 300b2 and the third adhesive film 300c may be included. Each of the plurality of second adhesive films 300b1 and 300b2 may include a second extension portion ('301b' of FIG. 1B) extending, relative to the side surfaces of the plurality of semiconductor chips 200b1 and 200b2 in the second direction (e.g., the X-axis direction), and having an upper surface including second recesses 300Rb1 and 300Rb2 concave in a direction toward the base chip 100 and a lower surface including protrusions 300Pb1 and 300Pb2 in the first recess 300Ra or the second recess 300Rb1. In this case, the plurality of second recesses 300Rb1 and 300Rb2 may be positioned to overlap (i.e., overlying and aligned vertically) the first recess 300Ra in the first direction (Z-axis direction) and may have substantially the same shape as that of the first recess 300Ra.

The lowermost second adhesive film 300b1 among the first adhesive film 300a and the plurality of second adhesive films 300b1 and 300b2 may have the same characteristics as those described above with reference to FIGS. 1A and 1B. For example, the first adhesive film 300a may be disposed between the base chip 100 and the first semiconductor chip 200a and may include the first recess 300Ra spaced apart from the side surface of the first semiconductor chip 200a by a predetermined distance ('La' of FIG. 1B) in the second direction (e.g., the X-axis direction). Also, the lowermost second adhesive film 300b1 may be disposed between the first semiconductor chip 200a and the lowermost second semiconductor chip 200b1 among the plurality of second semiconductor chips 200b1 and 200b2 and may include a (1-1)-th protrusion 300Pb1 in the first recess 300Ra and a (2-1)-th recess 300Rb1 overlapping the first recess 300Ra in the vertical direction (the Z-axis direction).

In addition, the second adhesive film 300b2 disposed between the plurality of second semiconductor chips 200b1 and 200b2 adjacent to each other, among the plurality of second adhesive films 300b1 and 300b2, may include a (1-2)-th protrusion 300Pb2 in the (2-1)-th recess 300Rb1 and a (2-2)-th recess 300Rb2 overlapping the (2-1)-th recess 300Rb1 in the vertical direction (the Z-axis direction).

The third adhesive film 300c may be disposed between the uppermost second semiconductor chip 200b2, among the plurality of second semiconductor chips 200b1 and 200b2, and the third semiconductor chip 200c. In addition, the third adhesive film 300c may include a third extension portion extending, relative to the side surface 200Sc of the third semiconductor chip 200c in the second direction (e.g., in the X-axis direction), and having an upper surface 300S1c including a third recess 300Rc spaced apart from a side surface of the third semiconductor chip 200c by a predetermined distance Lc and a lower surface including a second protrusion 300Pc in the (2-2)-th recess 300Rb2, as illustrated in FIG. 4. The distance Lc between the side surface of the third semiconductor 200c and the third recess 300Rc may be greater than the distance ('La' of FIG. 1B) between the first semiconductor chip 200a and the first recess 300Ra. In an embodiment, a depth Dc (FIG. 4) of the third recess 300Rc in the first direction (the Z-axis direction) may be less than the depths Da, Db1, Db2 (FIG. 4) of the respective first and second recesses 300Ra, 300Rb1, and 300Rb2. In addition, a ratio of the depth Dc of the third recess 300Rc to a height Hc from the upper surface 300S1c to the lower surface of the third adhesive film 300c (or the third extension portion) may range from about 0.5 or less or about 0.4 or less, for example, from about 0.5 to about 0.01 or from about 0.4 to about 0.1. In addition, a maximal width We of the third recess 300Rc in the second direction (e.g., the X-axis direction) may be less than the maximal width (e.g., 'Wa') of each of the first and second recesses. Also, the height Hc (FIG. 4) from the lower surface to the upper surface 300S1c of the third extension portion may be less than a height 200Hc from the upper surface of the uppermost second semiconductor chip 200b2 to the upper surface of the third semiconductor chip 200c. Accordingly, at least a portion of the side surface 200Sc of the third semiconductor chip 200c may be exposed from the third adhesive film 300c, and the encapsulant 400 may cover the upper surface 300S1c of the third adhesive film 300c and at least a portion of the side surface 200Sc of the third semiconductor chip 200c.

Figure 8A:
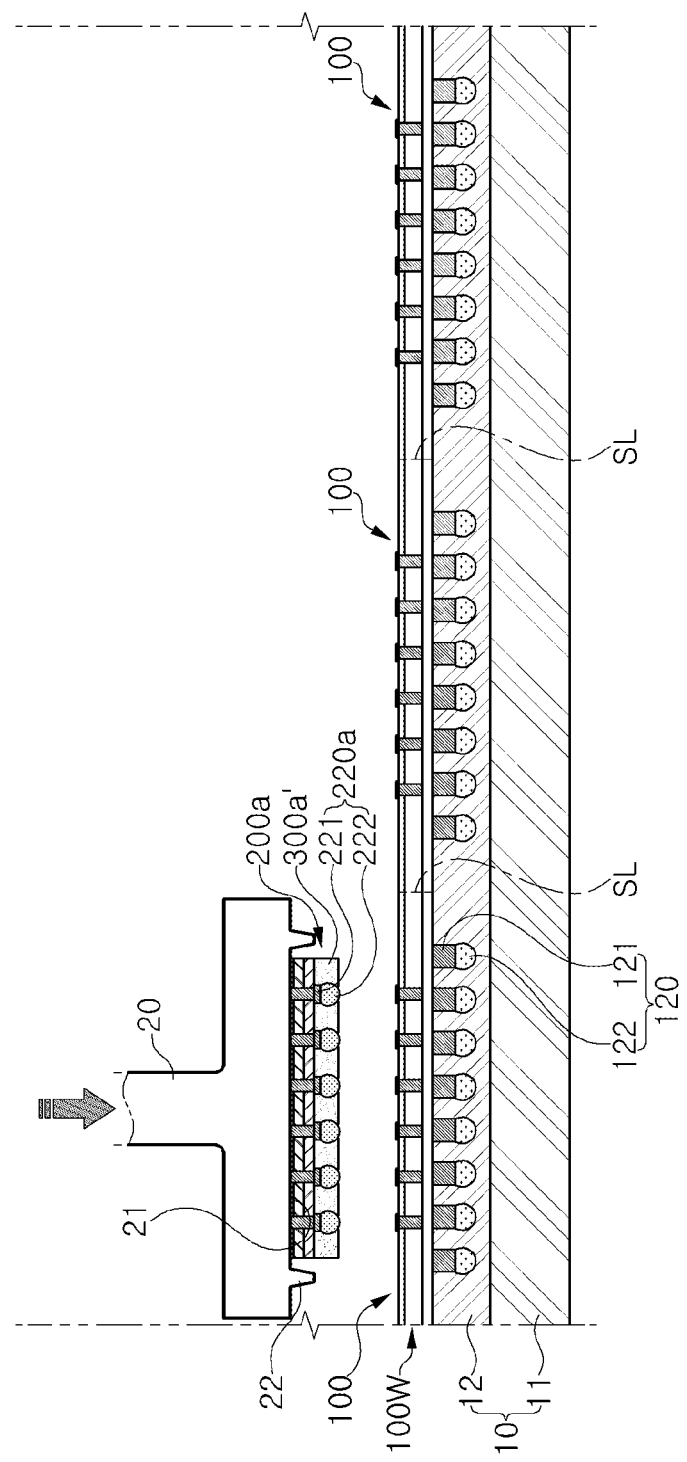
FIGS. 8A to 8F are cross-sectional views illustrating a process sequence of a method of manufacturing a semiconductor package according to an embodiment of the present inventive concept.
Figure 8B:
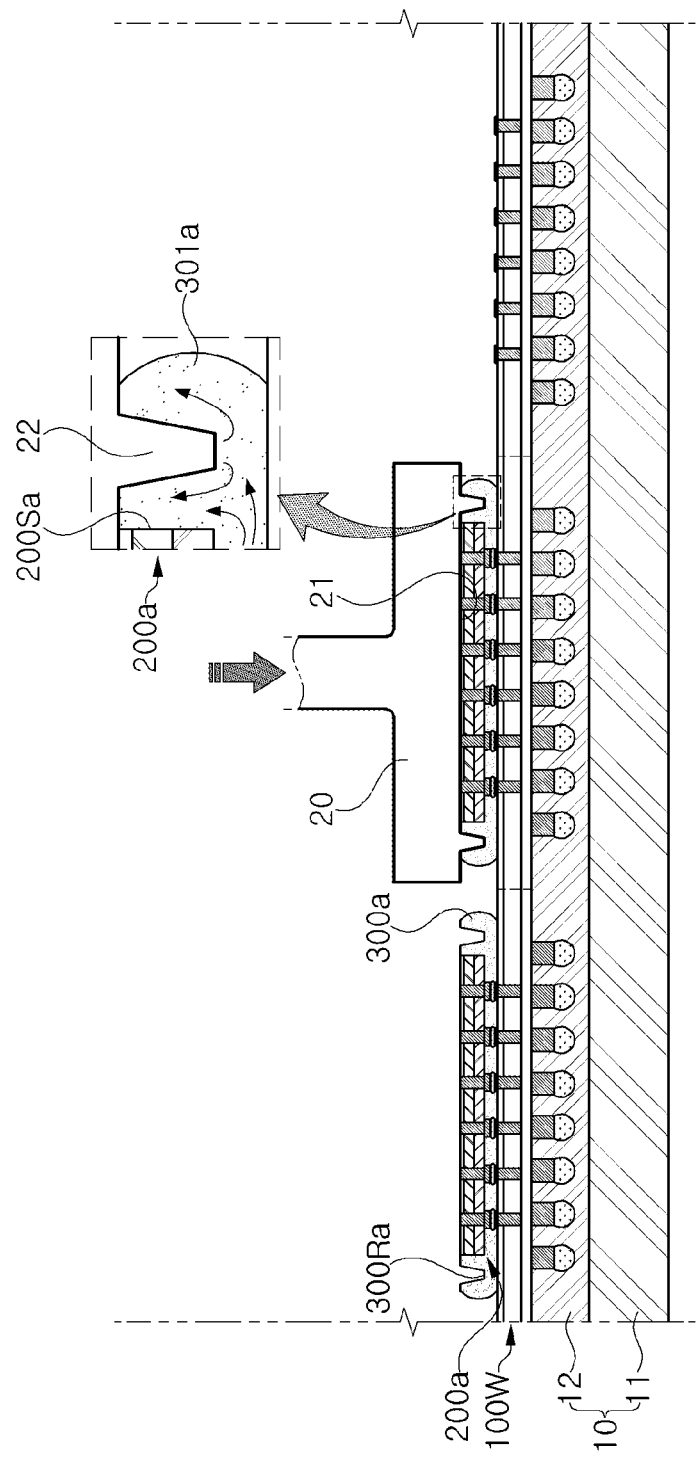
Figure 8C:
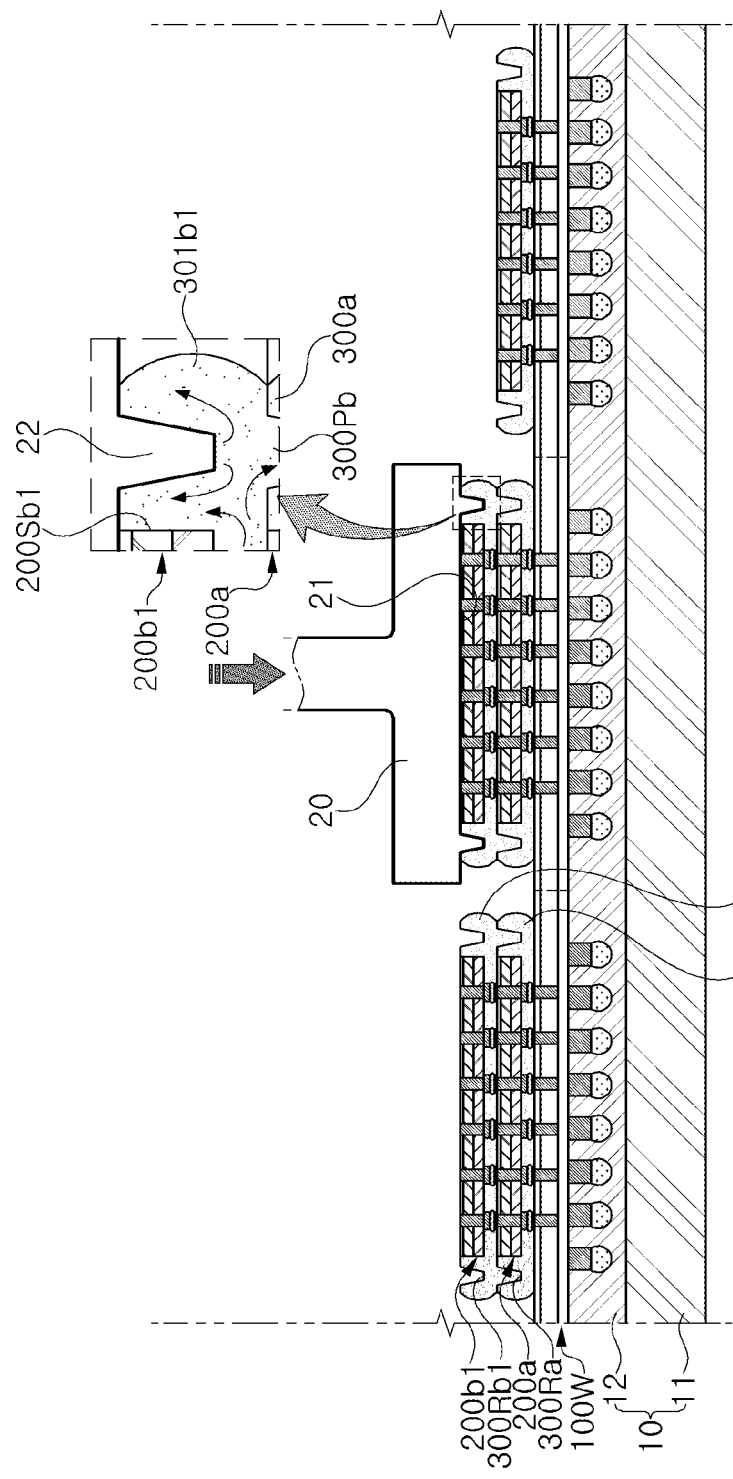
Figure 8D:
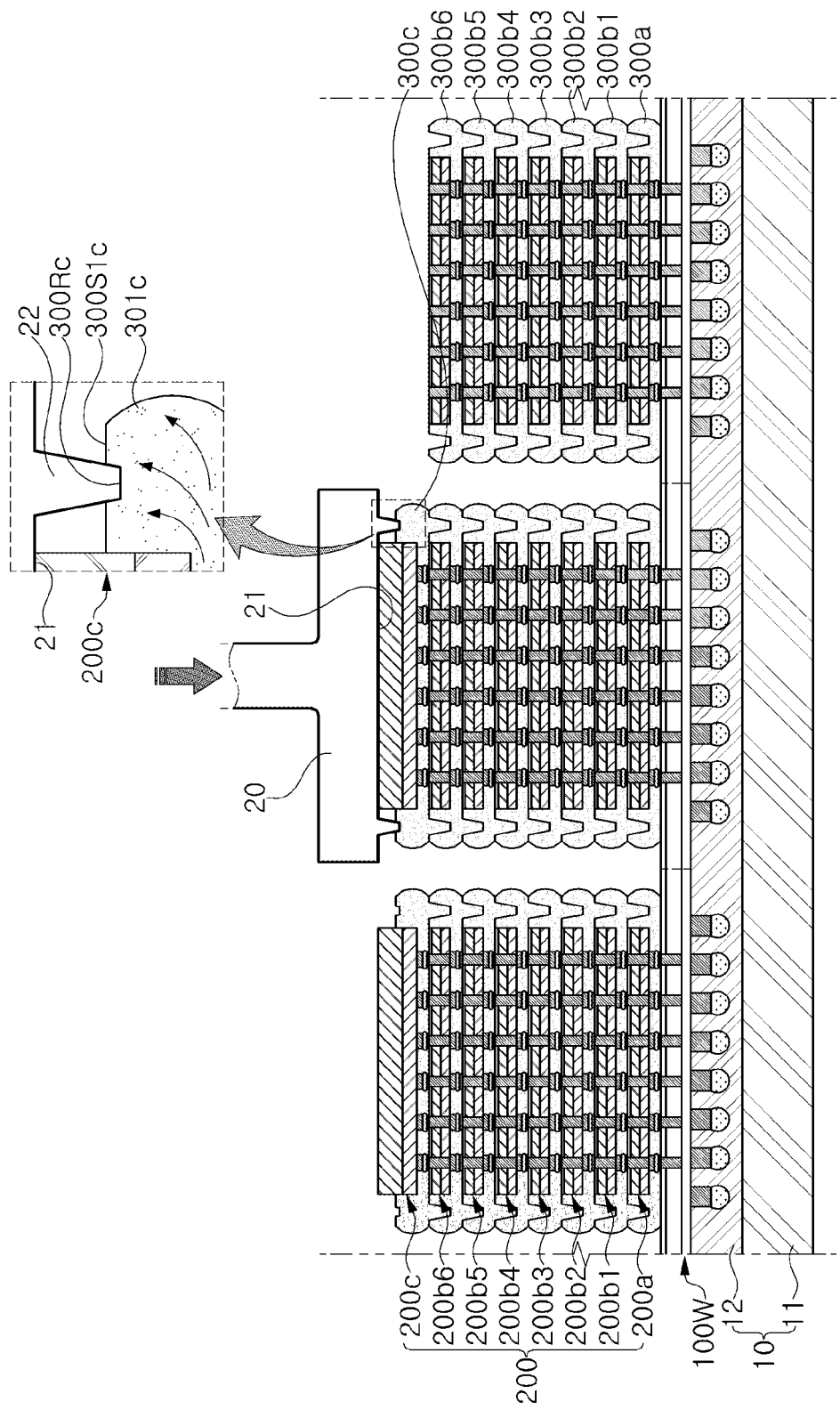

Such a structure may be understood as having a structural feature resulting from the method of manufacturing a package of the present inventive concept to form the recesses to correspond to the structure of an adsorption surface of the bonding device (see FIG. 8D). Meanwhile, since the upper surface 300S1c of the third adhesive film 300c may not directly contact the adsorption surface ('21' in FIG. 8D) of the bonding device, the upper surface 300S1c may not have such a flat shape as illustrated in the drawing. (See FIG. 8D). In this case, the upper surface 300S1c of the third adhesive film 300c (or the third extension portion) described above may be understood as the uppermost surface of the third adhesive film 300c.

Figure 5:
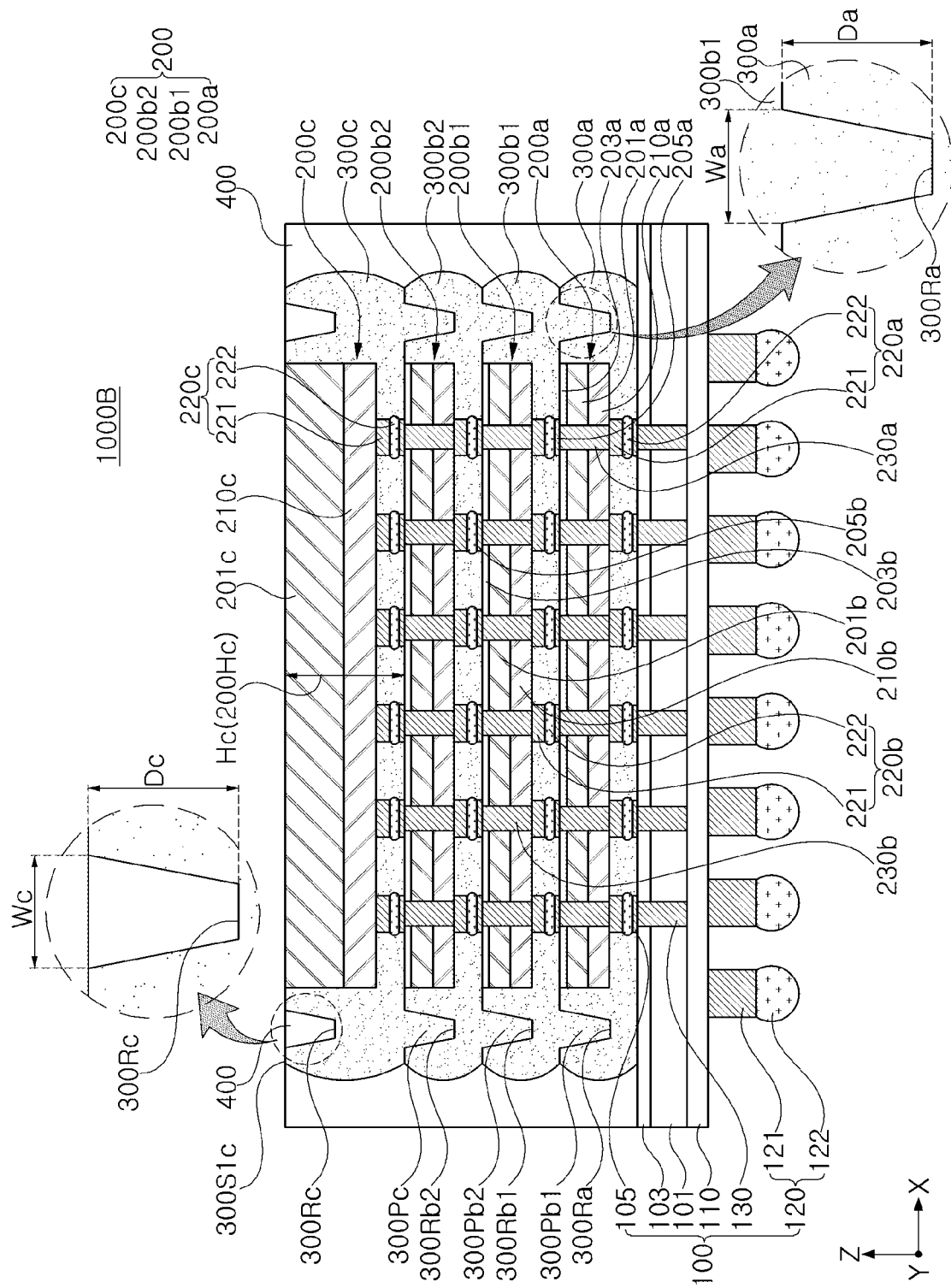
FIG. 5 is a cross-sectional view illustrating a semiconductor package according to an embodiment of the present inventive concept.

FIG. 5 is a cross-sectional view illustrating a semiconductor package 1000B according to an embodiment of the present inventive concept.

Referring to FIG. 5, a semiconductor package 1000B according to an embodiment may have the same characteristics as those of the semiconductor package 1000A illustrated in FIG. 4, except for a shape of the third adhesive film 300c. In an embodiment, the third adhesive film 300c may extend, relative to the side surface of the third semiconductor chip 200c, and include a third extension portion having an upper surface including a third recess 300Rc concave in a direction toward the base chip 100 and a lower surface including a protrusion 300Pc in the second recess 300Rb2, and the third recess 300Rc may have substantially the same shape as those of the first and second recesses 300Ra, 300Rb1, and 300Rb2. In addition, the height Hc from the lower surface to the upper surface 300S1c of the third adhesive film 300c (or the third extension portion) may be substantially the same as the height 200Hc from the upper surface of the uppermost second semiconductor chip 200b2 to the upper surface of the third semiconductor chip 200c. In this case, the third recess 300Rc may be filled with the encapsulant 400, and the upper surface 300S1c of the third adhesive film 300c may be exposed from the encapsulant 400. Also, the upper surface of the encapsulant 400, the upper surface 300S1c of the third adhesive film 300c, and the upper surface of the third semiconductor chip 200c may be substantially coplanar, as illustrated.

Figure 6:
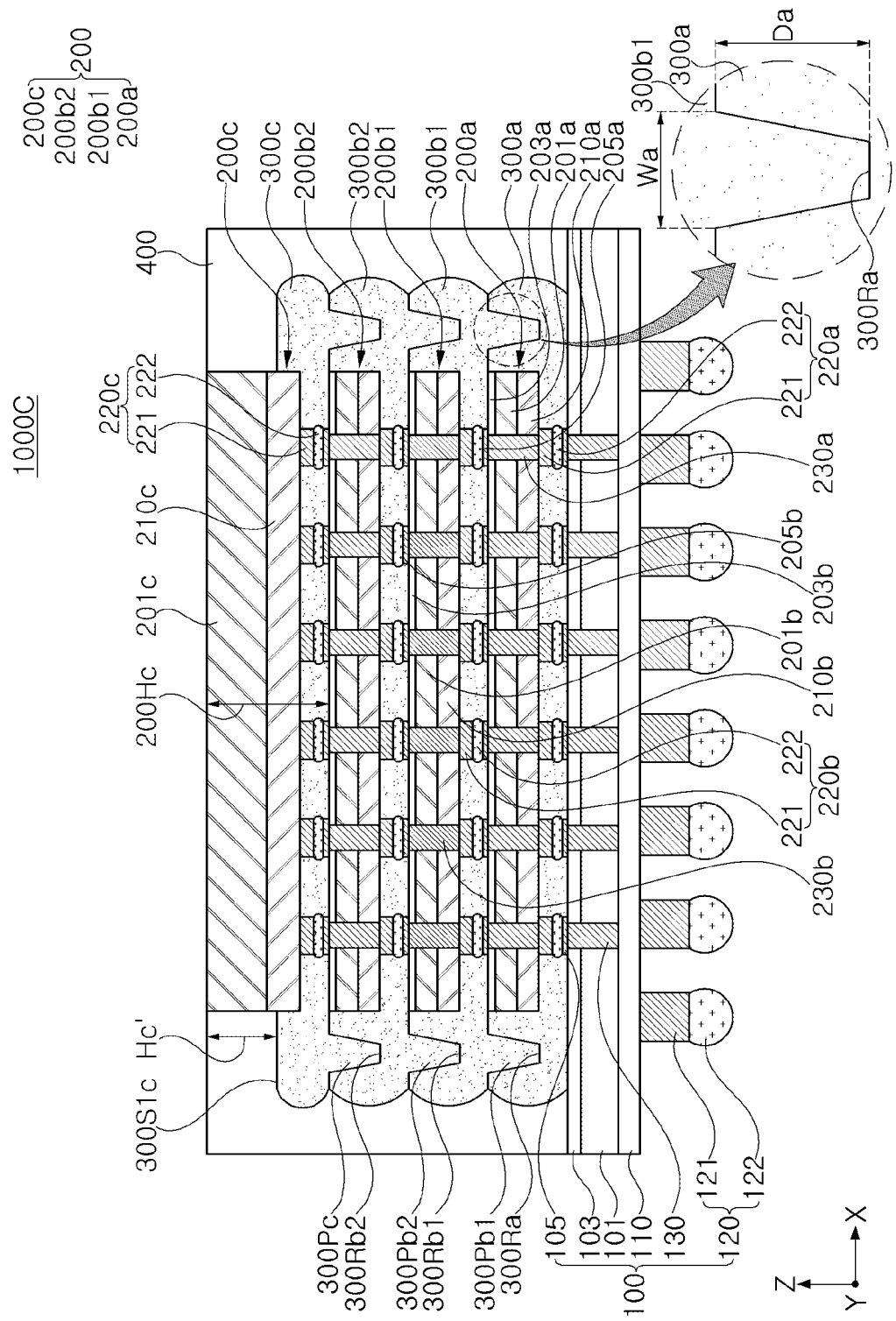
FIG. 6 is a cross-sectional view illustrating a semiconductor package according to an embodiment of the present inventive concept.

FIG. 6 is a cross-sectional view illustrating a semiconductor package 1000C according to an embodiment of the present inventive concept.

Referring to FIG. 6, a semiconductor package 1000C according to an example embodiment may have the same characteristics as those of the semiconductor package 1000A illustrated in FIG. 4, except for the shape of the third adhesive film 300c. In an embodiment, the third extension portion of the third adhesive film 300c may include a protrusion 300Pc in the second recess 300Rb2 on a lower surface thereof, but unlike the embodiment of FIG. 4, a recess may not be formed on an upper surface of the third extension portion or an upper surface of the third adhesive film 300c. In this case, a height Hc' from the upper surface 300S1c of the third adhesive film 300c to the upper surface of the encapsulant 400 may be greater than or equal to a depth (e.g., 'Da') of the first and second recesses 300Ra, 300Rb1, and 300Rb2. In this case, as described above, the upper surface 300S1c of the third adhesive film 300c may not have such a flat shape as illustrated in the drawing (see FIG. 8D), so the upper surface 300S1c of the third adhesive film 300c (or the third extension portion) may be understood as the uppermost surface of the third adhesive film 300c.

Figure 7A:
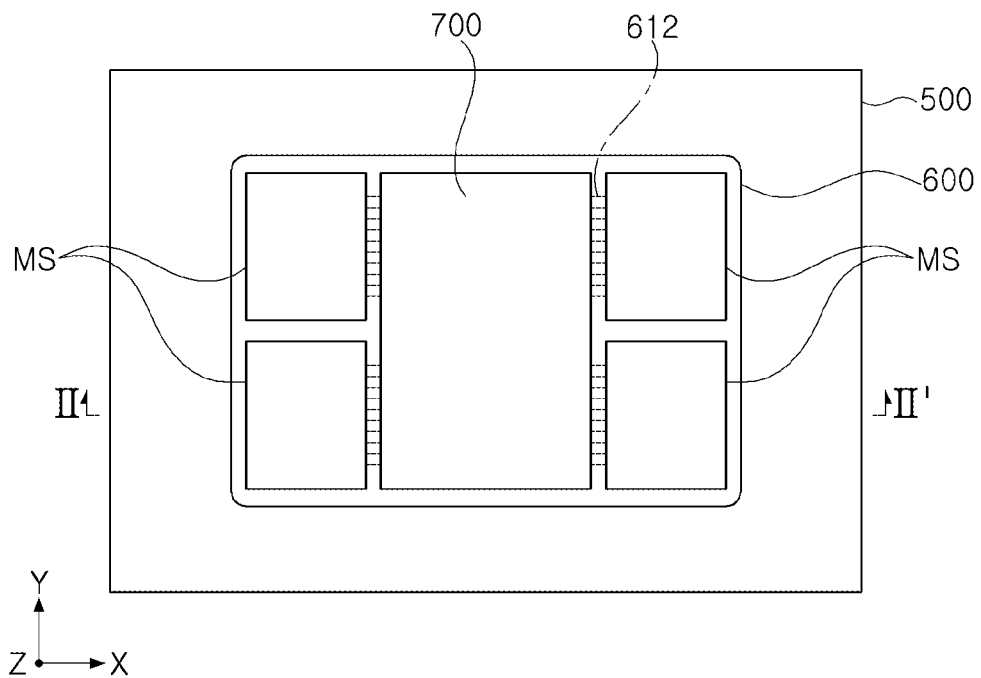
FIG. 7A is a plan view illustrating a semiconductor package according to an embodiment of the present inventive concept.
Figure 7B:
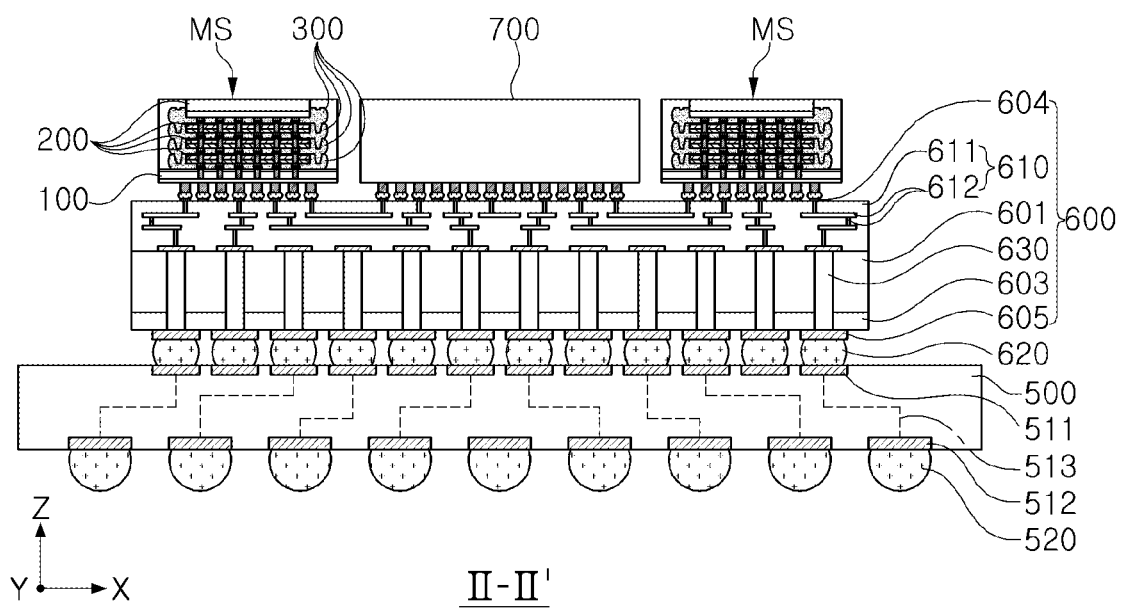
FIG. 7B is a cross-sectional view taken along line II-II' of FIG. 7A.

FIG. 7A is a plan view illustrating a semiconductor package 2000 according to an embodiment of the present inventive concept, and FIG. 7B is a cross-sectional view taken along the line II-II' of FIG. 7A.

Referring to FIGS. 7A and 7B, the semiconductor package 2000 according to an embodiment may include a package substrate 500, an interposer substrate 600, and at least one memory structure MS. In addition, the semiconductor package 2000 may further include a logic chip or a processor chip 700 disposed adjacent to the memory structure MS on the interposer substrate 600. The memory structure MS may be a package structure including the characteristics described above with reference to FIGS. 1A to 6.

The package substrate 500 may include a lower pad 512 disposed on a lower surface of a body, an upper pad 511 disposed on an upper surface of the body, and a redistribution circuit 513 electrically connecting the lower pad 512 and the upper pad 511 to each other. The package substrate 500 may be a support substrate on which the interposer substrate 600, the logic chip 700, and the memory structure MS are mounted, and may be a substrate for a semiconductor package including a printed circuit board (PCB), a ceramic substrate, a glass substrate, a tape circuit board, and the like. The body of the package substrate 500 may include different materials depending on a type of the substrate. For example, when the package substrate 500 is a PCB, it may have a form in which an interconnection layer is additionally stacked on a body copper clad laminate or one side or both sides of a copper clad laminate. Solder resist layers may be formed on each of lower and upper surfaces of the package substrate 500. The lower and upper pads 512 and 511 and the redistribution circuit 513 may form an electrical path connecting the lower surface and the upper surface of the package substrate 500. The lower and upper pads 512 and 511 and the redistribution circuit 513 may be include a metallic material, for example, at least one of copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), and carbon (C) or an alloy including two or more metals thereof. The redistribution circuit 513 may include multiple redistribution layers and vias connecting the redistribution layers. An external connection terminal 520 connected to the lower pad 512 may be disposed on a lower surface of the package substrate 500. The external connection terminal 520 may include tin (Sn), indium (In), bismuth (Bi), antimony (Sb), copper (Cu), silver (Ag), zinc (Zn), lead (Pb) and/or alloys thereof.

The interposer substrate 600 may include a substrate 601, a lower protective layer 603, a lower pad 605, an interconnection layer 610, a bump 620, and a through-electrode 630. The memory structure MS and the processor chip 700 may be stacked on the package substrate 500 via the interposer substrate 600. The interposer substrate 600 may electrically connect the memory structure MS and the processor chip 700 to each other.

The substrate 601 may be formed of, for example, any one of silicon, an organic material, a plastic, and a glass substrate. When the substrate 601 is a silicon substrate, the interposer substrate 600 may be referred to as a silicon interposer. Also, when the substrate 601 is an organic substrate, the interposer substrate 600 may be referred to as a panel interposer.

A lower protective layer 603 may be disposed on a lower surface of the substrate 601, and a lower pad 605 may be disposed on the lower protective layer 603. The lower pad 605 may be connected to the through-electrode 630. The memory structure MS and the processor chip 700 may be electrically connected to the package substrate 500 through bumps 620 disposed on the lower pad 605.

The interconnection layer 610 may be disposed on an upper surface of the substrate 601 and may include an interlayer insulating layer 611 and a single-layer or multi-layer interconnection structure 612. When the interconnection layer 610 has a multilayer interconnection structure, interconnections of different layers may be connected to each other through vertical contact.

The through-electrode 630 may extend from an upper surface to a lower surface of the substrate 601 to penetrate through the substrate 601. Also, the through-electrode 630 may extend into the interconnection layer 610 and be electrically connected to the interconnections of the interconnection layer 610. When the substrate 601 is silicon, the through-electrode 630 may be referred to as a TSV. Other structures and materials of the through-electrode 630 are the same as those described for the semiconductor package 1000A of FIG. 4. According to an embodiment, the interposer substrate 600 may include only an interconnection layer therein but may not include a through-electrode.

The interposer substrate 600 may be used for the purpose of converting or transferring an input electrical signal between the package substrate 500 and the memory structure MS or the processor chip 700. Accordingly, the interposer substrate 600 may not include devices such as active devices or passive devices. Also, according to an embodiment, the interconnection layer 610 may be disposed below the through-electrode 630. For example, a positional relationship between the interconnection layer 610 and the through-electrode 630 may be relative.

The bumps 620 may be disposed on a lower surface of the interposer substrate 600 and may be electrically connected to the interconnection of the interconnection layer 610. The interposer substrate 600 may be stacked on the package substrate 500 through the bumps 620. The bumps 620 may be connected to the interconnections 612 of the interconnection layer 610 through the through-electrode 630 and the lower pad 605. In an example, some of the lower pads 605 used for power or ground may be integrated and connected to the bumps 620, so that the number of the lower pads 605 may be greater than the number of the bumps 620.

The logic chip or processor chip 700 may include, for example, central processing units (CPUs), graphics processing units (GPUs), field programmable gate arrays (FPGAs), digital signal processors (DSPs), cryptographic processors, microprocessors, microcontrollers, analog-to-digital converters, application-specific ICs (ASICs), and the like. According to the types of devices included in the logic chip 700, the semiconductor package 2000 may be classified into a server-oriented semiconductor package or a mobile-oriented semiconductor package.

The memory structure MS may have characteristics similar to those of the semiconductor packages 1000A, 1000B, and 1000C described above with reference to FIGS. 4 to 6. For example, the memory structure MS may include a base chip 100, a chip structure 200 on the base chip 100, and a plurality of adhesive films 300 having recesses and protrusions formed thereon. According to an embodiment, the semiconductor package 2000 may further include an internal sealant covering the side and upper surfaces of the memory structure MS and the processor chip 700 on the interposer substrate 600. In addition, the semiconductor package 2000 may further include an external sealant covering the interposer substrate 600 and the internal sealant on the package substrate 500. According to an embodiment, the external sealant and the internal sealant may be formed together so that they may not be distinguished from each other. Also, according to an embodiment, the internal sealant may not cover the upper surface of the processor chip 700 and the upper surface of the memory structure MS.

FIGS. 8A to 8F are cross-sectional views illustrating a process sequence of a method of manufacturing a semiconductor package according to an embodiment of the present inventive concept.

Referring to FIG. 8A, first, a base chip 100 may be prepared. The base chip 100 may be a semiconductor wafer 100W including a plurality of base chips 100 separated by a scribe lane SL. The semiconductor wafer 100W may be disposed on a carrier 10. The carrier 10 may include a support substrate 11 and an adhesive material layer 12. The semiconductor wafer 100W may be attached to the carrier 10 such that a lower surface of the base chip 100 on which the bump structure 120 is disposed faces the adhesive material layer 12. The bump structure 120 may be covered by the adhesive material layer 12, and the lower surface of the semiconductor wafer 100W may be in contact with the upper surface of the adhesive material layer 12.

Next, a plurality of first semiconductor chips 200a stacked on the plurality of base chips 100 may be prepared. The first semiconductor chip 200a may be in a state in which a first adhesive film layer 300a' surrounding the bump structure 220a is formed on a lower surface thereof. The first adhesive film layer 300a' may be formed to expose at least a portion of the solder portion 222 of the bump structure 220a, but may also be formed to completely cover the solder portion 222 according to an embodiment. The first semiconductor chip 200a may be vacuum-adsorbed on an adsorption surface 21 of the bonding device 20 and picked and placed onto the semiconductor wafer 100W. The bonding device 20 may include an adsorption surface 21 on which the first semiconductor chip 200a is adsorbed and a dam structure 22 surrounding the adsorption surface 21. The dam structure 22 may form a recess ('300Ra' in FIG. 8B) in a first adhesive film layer 300a' expanded in a subsequent thermal compression process.

Referring to FIG. 8B, a first semiconductor chip 200a is stacked on the semiconductor wafer 100W using the bonding device 20, and the first semiconductor chip 200a may be fixed to the semiconductor wafer 100W by performing a thermal compression process. The thermal compression process may be performed by adjusting process conditions (e.g., pressure during thermocompression bonding, the amount of a non-conductive material constituting the adhesive film, etc.) such that a first extension portion 301a extending outwardly, relative to a side surface 200Sa of the first semiconductor chip 200a, and having a first recess 300Ra corresponding to the dam structure 22 is formed at one end of a first adhesive film 300a. The dam structure 22 may be spaced apart from the side surface 200Sa of the first semiconductor chip 200a by a predetermined distance (refer to 'La' in FIG. 1B), and the first recess 300Ra may also have a corresponding distance. A non-conductive material layer extending outwardly, relative to the side surface 200Sa of the first semiconductor chip 200a, may receive a flow force directing to a space surrounding the dam structure 22. Accordingly, the dam structure 22 may be surrounded by a non-conductive material, and a first recess 300Ra corresponding to the shape of the dam structure 22 may be formed on the upper surface of the first extension portion 301a. In addition, an adhesive force of the first adhesive film 300a may be improved by the flow force.

Referring to FIG. 8C, a second semiconductor chip 200b1 is stacked on the first semiconductor chip 200a using the bonding device 20, and the second semiconductor chip 200b1 may be fixed by performed a thermal compression process. The thermal compression process may be performed by adjusting process conditions (e.g., pressure during thermocompression bonding, the amount of a non-conductive material constituting the adhesive film, etc.) such that a second extension portion 301b1 extending outwardly, relative to a side surface 200Sb1 of the second semiconductor chip 200*b*1, and having a second recess 300R*b*1 corresponding to the dam structure 22 and a first protrusion 300Pb in the first recess 300Ra is formed at one end of a second adhesive film 300*b*1. By the dam structure 22, a flow force toward the bonding device 20 and the first recess 300Ra may be generated in the non-conductive material layer extending outwardly, relative to the side surface 200Sb1 of the second semiconductor chip 200*b*1. That is, since the second recess 300R*b*1 is also formed of a non-conductive material surrounding the dam structure 22, the second recess 300R*b*1 may have substantially the same shape as the first recess 300Ra and may be positioned to overlap the first recess 300Ra in the vertical direction. Thereafter, a plurality of second semiconductor chips and a plurality of second adhesive films may be formed on the first semiconductor chip 200*a* by repeatedly performing stacking and bonding processes of the second semiconductor chip.

Referring to FIG. 8D, a third semiconductor chip 200*c* is stacked on the plurality of second semiconductor chips 200*b*1, 200*b*2, 200*b*3, 200*b*4, 200*b*5, and 200*b*6 using the bonding device 20, and a thermal compression process may be performed to complete the chip stack 200. In an embodiment, the thermal compression process for the third semiconductor chip 200*c* may be performed such that a third extension portion 301*c* extending outwardly, relative to a side surface of the second semiconductor chip 200*c*, and having a third recess 300Rc corresponding to a lower shape of the dam structure 22 is formed at one end of the second adhesive film 300*c*. Because a thickness of the third semiconductor chip 200*c* is greater than a thickness of the other semiconductor chips 200*a*, 200*b*1, etc., a contact area of the non-conductive material forming the dam structure 22 and the third adhesive film 300*c* is relatively reduced to adjust an overall thickness of the semiconductor package. Accordingly, in some embodiments, a flow force increases according to process conditions (e.g., pressure during thermocompression bonding, the amount of a non-conductive material constituting the adhesive film, etc.) so that the third recess 300Rc corresponding to an overall shape of the dam structure 22 may be formed (refer to the embodiment of FIG. 5), or conversely, the third recess 300Rc may not be formed (see the embodiment of FIG. 6).

Figure 8E:
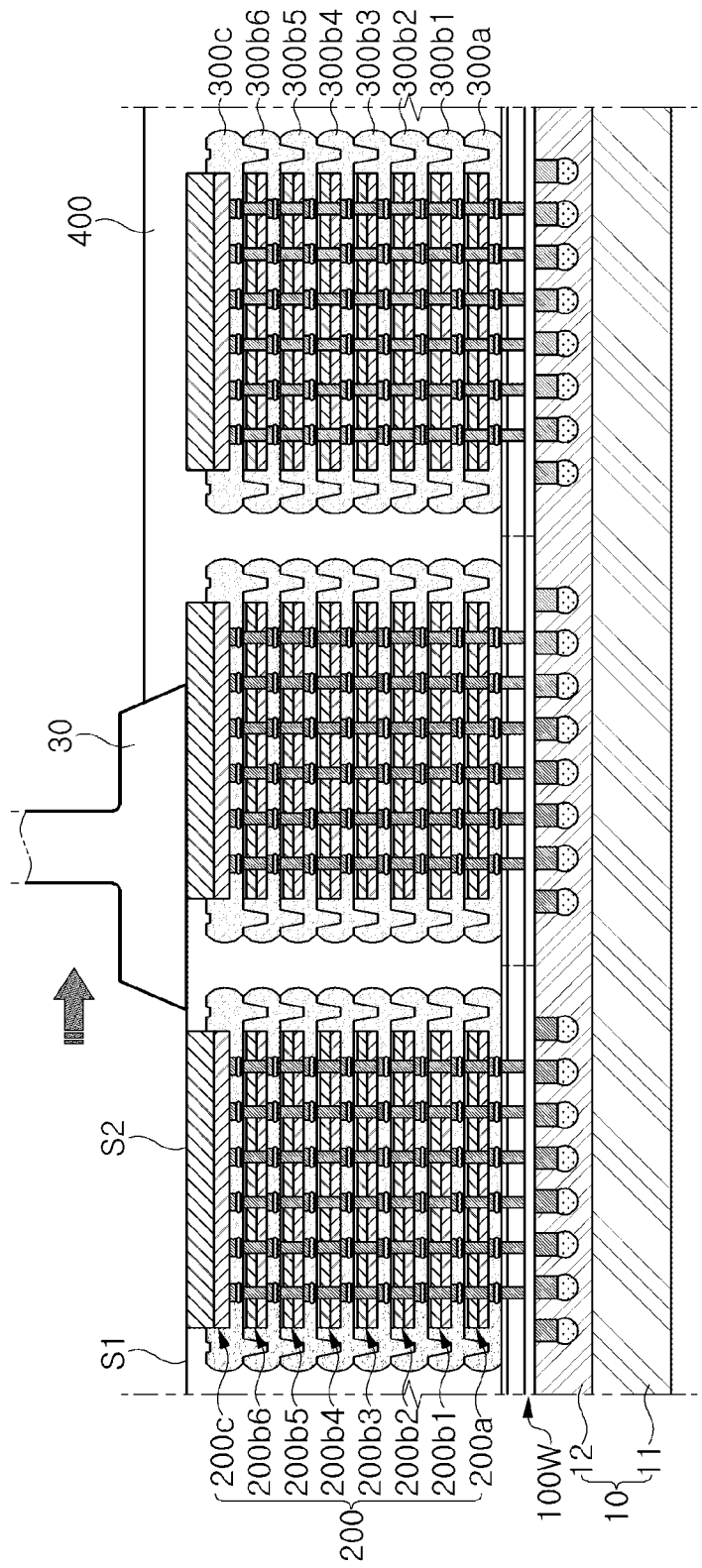

Referring to FIG. 8E, an encapsulant 400 may be formed on the semiconductor wafer 100W, and an upper surface of the encapsulant 400 may be planarized using a polishing device 30. In an embodiment, the encapsulant 400 may be formed to cover a side surface of each of the first to third adhesive films 300*a*, 300*b*1, 300*b*2, 300*b*3, 300*b*4, 300*b*5, 300*b*6, and 300*c*, an upper surface of the third adhesive film 300*c*, and a side surface of the third semiconductor chip 200*c*. Through the planarization process, an upper surface S1 of the encapsulant 400 may be substantially coplanar with an upper surface S2 of the third semiconductor chip 200*c*. An upper portion of the third semiconductor chip 200*c* may be partially removed by the planarization process. The planarization process may be performed, for example, by a chemical mechanical polishing (CMP) process.

Figure 8F:
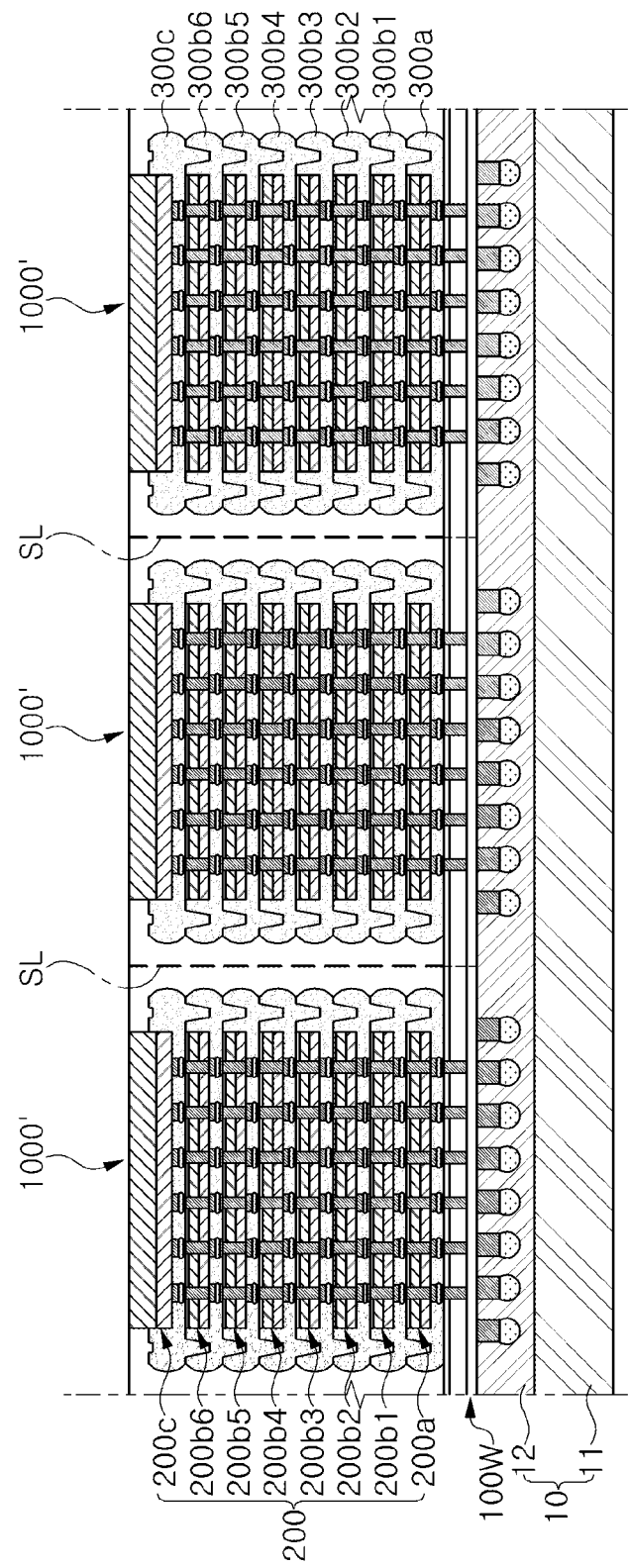

Referring to FIG. 8F, a plurality of semiconductor packages 1000' may be separated by cutting the encapsulant 400 and the semiconductor wafer 100W along a scribe lane SL. The plurality of semiconductor packages 1000' may include the same or similar characteristics as those of the semiconductor packages described above with reference to FIGS. 1A to 6. The semiconductor package 1000' completed through the manufacturing process described above has a concave-convex structure including recesses and protrusions between the plurality of adhesive films 300*a*, 300*b*1, 300*b*2, 300*b*3, 300*b*4, 300*b*5, 300*b*6, and 300*c*, whereby delamination of the adhesive films and propagation of cracks may be prevented, resulting in improvement of reliability of the semiconductor package 1000'.

As so far set forth above, according to embodiments of the present inventive concept, a semiconductor package having improved reliability by introducing a concave-convex structure in an extension portion of an adhesive film may be provided.

While example embodiments have been shown and described above, it will be apparent to those skilled in the art that modifications and variations could be made without departing from the scope of the present inventive concept as defined by the appended claims.

What is claimed is:

1. A semiconductor package comprising:
a base chip;
a first semiconductor chip, a plurality of second semiconductor chips, and a third semiconductor chip sequentially stacked on the base chip in a first direction and electrically connected to each other by a through silicon via (TSV);
a first adhesive film between the base chip and the first semiconductor chip;
a plurality of second adhesive films, one of the plurality of second adhesive films between the first semiconductor chip and a lowermost second semiconductor chip, and respective other ones of the plurality of second adhesive films between adjacent ones of the plurality of second semiconductor chips;
a third adhesive film between an uppermost one of the second semiconductor chips and the third semiconductor chip; and
an encapsulant encapsulating at least a portion of each of the first semiconductor chip, the plurality of second semiconductor chips, and the third semiconductor chip on the base chip,
wherein the first adhesive film comprises a first extension portion extending outwardly relative to a side surface of the first semiconductor chip in a second direction that is perpendicular to the first direction, wherein the first extension portion comprises an upper surface having a first recess that is concave in a direction toward the base chip, and
wherein each of the plurality of second adhesive films comprises a second extension portion extending outwardly relative to respective side surfaces of the plurality of second semiconductor chips in the second direction, wherein each second extending portion comprises an upper surface having a second recess that is concave in a direction toward the base chip, and a lower surface having a protrusion, wherein the protrusion of the second adhesive film between the first semiconductor chip and the lowermost second semiconductor chip is in the first recess, and wherein the protrusion of each of the other ones of the plurality of second adhesive films is in the second recess of a respective underlying second adhesive film.

2. The semiconductor package of claim 1, wherein the plurality of second recesses are aligned with the first recess in the first direction.

3. The semiconductor package of claim 1, wherein the plurality of second recesses have substantially a same shape as a shape of the first recess.

4. The semiconductor package of claim 1, wherein the encapsulant is on a side surface of the first adhesive film, side surfaces of the plurality of second adhesive films, and a side surface and an upper surface of the third adhesive film, and wherein an upper surface of the encapsulant, the upper surface of the third adhesive film, and an upper surface of the third semiconductor chip are coplanar.

5. The semiconductor package of claim 1, wherein
the third adhesive film comprises a third extension portion extending relative to a side surface of the third semiconductor chip in the second direction, wherein the third extension portion comprises an upper surface having a third recess that is concave in a direction toward the base chip, and a lower surface having a protrusion in the second recess,
wherein a depth of the third recess in the first direction is smaller than a depth of each of the first and second recesses in the first direction.

6. The semiconductor package of claim 5, wherein a ratio of the depth of the third recess to a height from the upper surface to the lower surface of the third adhesive film is about 0.4 or less.

7. The semiconductor package of claim 5, wherein a width of the third recess in the second direction is less than a width of each of the first and second recesses in the second direction.

8. The semiconductor package of claim 5, wherein a height from the lower surface to the upper surface of the third extension portion is less than a height from an upper surface of the uppermost second semiconductor chip to an upper surface of the third semiconductor chip.

9. The semiconductor package of claim 1, wherein the third adhesive film comprises a third extension portion extending outwardly relative to a side surface of the third semiconductor chip in the second direction, wherein the third extension portion comprises an upper surface having a third recess that is concave in a direction toward the base chip, and a lower surface having a protrusion in the second recess.

10. The semiconductor package of claim 9, wherein a height from the lower surface to the upper surface of the third extension portion is substantially equal to a height from an upper surface of the uppermost second semiconductor chip to an upper surface of the third semiconductor chip.

11. A semiconductor package comprising:
a base chip;
a first semiconductor chip and a second semiconductor chip sequentially stacked on the base chip in a first direction and electrically connected to each other by a through silicon via (TSV);
a first adhesive film between the base chip and the first semiconductor chip and comprising a first extension portion extending outwardly relative to a side surface of the first semiconductor chip in a second direction that is perpendicular to the first direction; and
a second adhesive film between the first semiconductor chip and the second semiconductor chip and comprising a second extension portion extending outwardly relative to a side surface of the second semiconductor chip in the second direction,
wherein an upper surface of the first extension portion is coplanar with an upper surface of the first semiconductor chip, and wherein the first extension portion comprises a first recess that is concave in a direction toward the base chip, and
wherein a lower surface of the second extension portion is in contact with the upper surface of the first extension portion and comprises a protrusion in the first recess.

12. The semiconductor package of claim 11, wherein a ratio of a distance between the first recess and the side surface of the first semiconductor chip to a length of the first extension portion in the second direction is about 0.2 or greater.

13. The semiconductor package of claim 11, wherein a ratio of a width of the first recess in the second direction to a length of the first extension portion in the second direction ranges from about 0.3 to about 0.7.

14. The semiconductor package of claim 11, wherein a ratio of a depth of the first recess to a height from a lower surface to the upper surface of the first extension portion is about 0.8 or less.

15. The semiconductor package of claim 11, wherein the first recess continuously or discontinuously surrounds the side surface of the first semiconductor chip.

16. A semiconductor package comprising:
a base chip;
a chip stack comprising a first semiconductor chip on the base chip, a second semiconductor chip on the first semiconductor chip, and a third semiconductor chip on the second semiconductor chip, the first, second and third semiconductor chips stacked in a first direction;
a first adhesive film between the base chip and the first semiconductor chip, wherein the first adhesive film comprises a first recess spaced apart from a side surface of the first semiconductor chip in a second direction that is perpendicular to a first direction;
a second adhesive film between the first semiconductor chip and the second semiconductor chip, wherein the second adhesive film comprises a second recess spaced apart from a side surface of the second semiconductor chip in the second direction, and a first protrusion in the first recess; and
a third adhesive film between the second semiconductor chip and the third semiconductor chip, wherein the third adhesive film comprises a second protrusion in the second recess,
wherein at least a portion of the second recess overlaps the first recess in the first direction.

17. The semiconductor package of claim 16, wherein the base chip has a width in the second direction that is greater than a width of each of the first, second and third semiconductor chips in the second direction.

18. The semiconductor package of claim 16, wherein the base chip has a width in the second direction that is greater than a width of each of the first, second and third adhesive films in the second direction.

19. The semiconductor package of claim 16, wherein
the base chip and the first and second semiconductor chips each comprise a respective through silicon via, and
wherein the base chip and the first, second and third semiconductor chips are electrically connected to each other through the through silicon vias.

20. The semiconductor package of claim 19, wherein the base chip further comprises a bump structure below the base chip and electrically connected to the base chip through silicon via.

* * * * *